(12) United States Patent
Ottogalli et al.

(10) Patent No.: US 8,889,520 B2
(45) Date of Patent: Nov. 18, 2014

(54) BIPOLAR JUNCTION TRANSISTORS, MEMORY ARRAYS, AND METHODS OF FORMING BIPOLAR JUNCTION TRANSISTORS AND MEMORY ARRAYS

(71) Applicant: Micron Technology, Inc., Boise, ID (US)

(72) Inventors: Federica Ottogalli, Gorgonzola (IT); Luca Laurin, Lissone (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/286,746

(22) Filed: May 23, 2014

(65) Prior Publication Data

US 2014/0273390 A1 Sep. 18, 2014

Related U.S. Application Data

(62) Division of application No. 13/415,288, filed on Mar. 8, 2012, now Pat. No. 8,766,235.

(51) Int. Cl.
| | |
|---|---|
| H01L 21/8222 | (2006.01) |
| H01L 27/24 | (2006.01) |
| H01L 29/66 | (2006.01) |
| H01L 29/732 | (2006.01) |
| H01L 27/102 | (2006.01) |
| H01L 45/00 | (2006.01) |

(52) U.S. Cl.
CPC .......... *H01L 27/24* (2013.01); *H01L 29/66272* (2013.01); *H01L 29/732* (2013.01); *H01L 27/1026* (2013.01); *H01L 27/2445* (2013.01); H01L 45/06 (2013.01); H01L 45/1233 (2013.01)
USPC .......................................... 438/349

(58) Field of Classification Search
CPC ... H01L 27/24; H01L 29/66272; H01L 45/04; H01L 21/76297; H01L 27/00; G11C 11/34
USPC ......... 257/5, E24.072, E21.35, E45.002, 526; 438/349
See application file for complete search history.

(56) References Cited

U.S. PATENT DOCUMENTS

| | | |
|---|---|---|
| 4,719,185 A | 1/1988 | Goth |
| 6,600,199 B2 | 7/2003 | Voldman et al. |

(Continued)

OTHER PUBLICATIONS

Pellizzer et al., "A 90nm Phase Change Memory Technology for Stand-Alone Non-Volatile Memory Applications", IEEE, VLSI Technology, 2006, Digest of Technical Papers, 2006 Symposium, 2 pages.

*Primary Examiner* — Fernando L Toledo
*Assistant Examiner* — Neil Prasad
(74) *Attorney, Agent, or Firm* — Wells St. John P.S.

(57) ABSTRACT

Some embodiments include methods of forming BJTs. A first type doped region is formed within semiconductor material. First and second trenches are formed within the semiconductor material to pattern an array of pedestals, and the trenches are filled with electrically insulative material. An upper portion of the first type doped region is counter-doped to form a first stack having a second type doped region over a first type doped region, and an upper portion of the first stack is then counter-doped to form a second stack having a second type doped region between a pair of first type doped regions. Some embodiments include a BJT array. A base implant region is between a pair of emitter/collector implant regions. Electrically insulative material is adjacent the base implant region, and contains at least about $7 \times 10^{16}$ atoms/cm$^3$ of base implant region dopant.

12 Claims, 24 Drawing Sheets

(56) References Cited

U.S. PATENT DOCUMENTS

| | | |
|---|---|---|
| 7,811,879 B2 | 10/2010 | Lam et al. |
| 7,834,341 B2 | 11/2010 | Wu et al. |
| 7,847,373 B2 | 12/2010 | Pirovano et al. |
| 8,049,271 B2 | 11/2011 | Blanchard et al. |
| 8,076,211 B2 | 12/2011 | Pirovano et al. |
| 8,310,864 B2 | 11/2012 | Lung et al. |
| 2007/0023811 A1 | 2/2007 | Voegeli et al. |
| 2010/0006816 A1 | 1/2010 | Magistretti et al. |
| 2011/0233727 A1 | 9/2011 | Chen et al. |
| 2011/0248382 A1 | 10/2011 | Pellizzer et al. |

US 8,889,520 B2

BIPOLAR JUNCTION TRANSISTORS, MEMORY ARRAYS, AND METHODS OF FORMING BIPOLAR JUNCTION TRANSISTORS AND MEMORY ARRAYS

RELATED PATENT DATA

This patent resulted from a divisional of U.S. patent application Ser. No. 13/415,288, which was filed Mar. 8, 2012, and which is hereby incorporated herein by reference.

TECHNICAL FIELD

Bipolar junction transistors, memory arrays, and methods of forming bipolar junction transistors and memory arrays.

BACKGROUND

Integrated circuits may comprise memory. Integrated memory is usually fabricated in one or more arrays of individual memory cells. The memory cells have at least two different selectable states. In a binary system, the states are considered as either a "0" or a "1". In other systems, at least some individual memory cells may be configured to store more than two levels or states of information.

One type of memory cell utilizes a transistor (or other suitable select device) in combination with a resistor. The resistor is a memory storage element and comprises programmable material. The memory may be incorporated into Resistive Random Access Memory (RRAM).

Numerous programmable materials are known which can be suitable for utilization in resistive memory storage elements. For instance, phase change materials (such as, for example, various chalcogenides) may be utilized as programmable materials in phase change memory (PCM). As another example, some programmable materials may utilize ions as mobile charge carriers to transition from one memory state to another.

There may be advantages for utilizing bipolar junction transistors (BJTs) as select devices. Such advantages may include improved ability to pass programming current relative to other types of select devices; improved current density relative to other types of select devices; improved scalability relative to other types of select devices and/or improved access speed through BJTs relative to other types of select devices.

It would be desirable to develop improved methods for incorporating BJTs as select devices. It would also be desirable to develop improved memory array architectures incorporating BJTs as select devices.

DETAILED DESCRIPTION OF THE ILLUSTRATED EMBODIMENTS

Some embodiments include utilization of new doping/patterning sequences for fabrication of BJT select devices of memory arrays, and some embodiments include new memory architectures comprising BJTs as select devices.

Example embodiments are described with reference to FIGS. 1-24.

Figure 1:
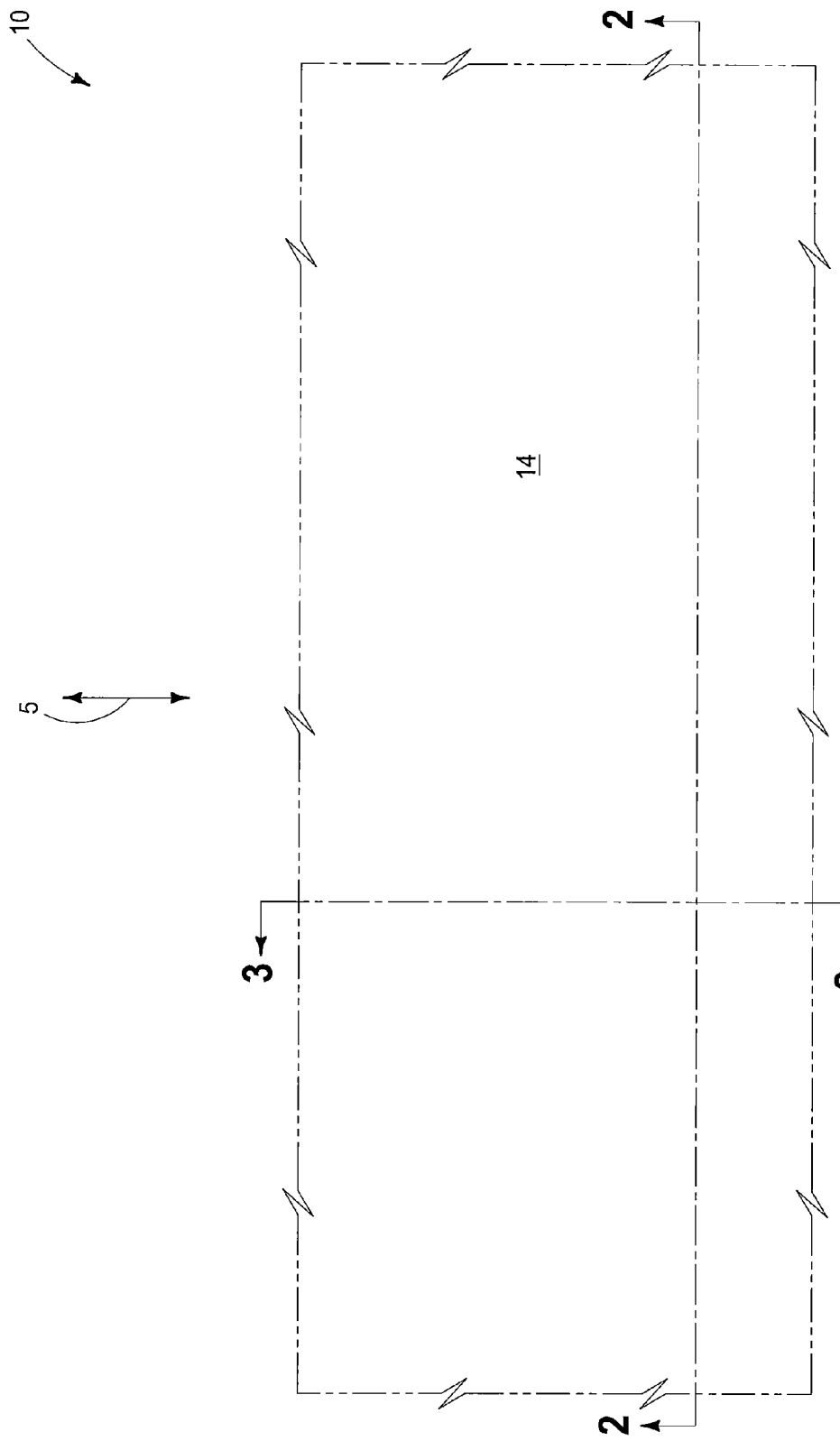
FIGS. 1-3 are a top view and cross-sectional side views of a portion of semiconductor construction at a processing stage of an example embodiment. The cross-sectional view of FIG. 2 is along the lines 2-2 of FIGS. 1 and 3; and the cross-sectional view of FIG. 3 is along the lines 3-3 of FIGS. 1 and 2.
Figure 2:
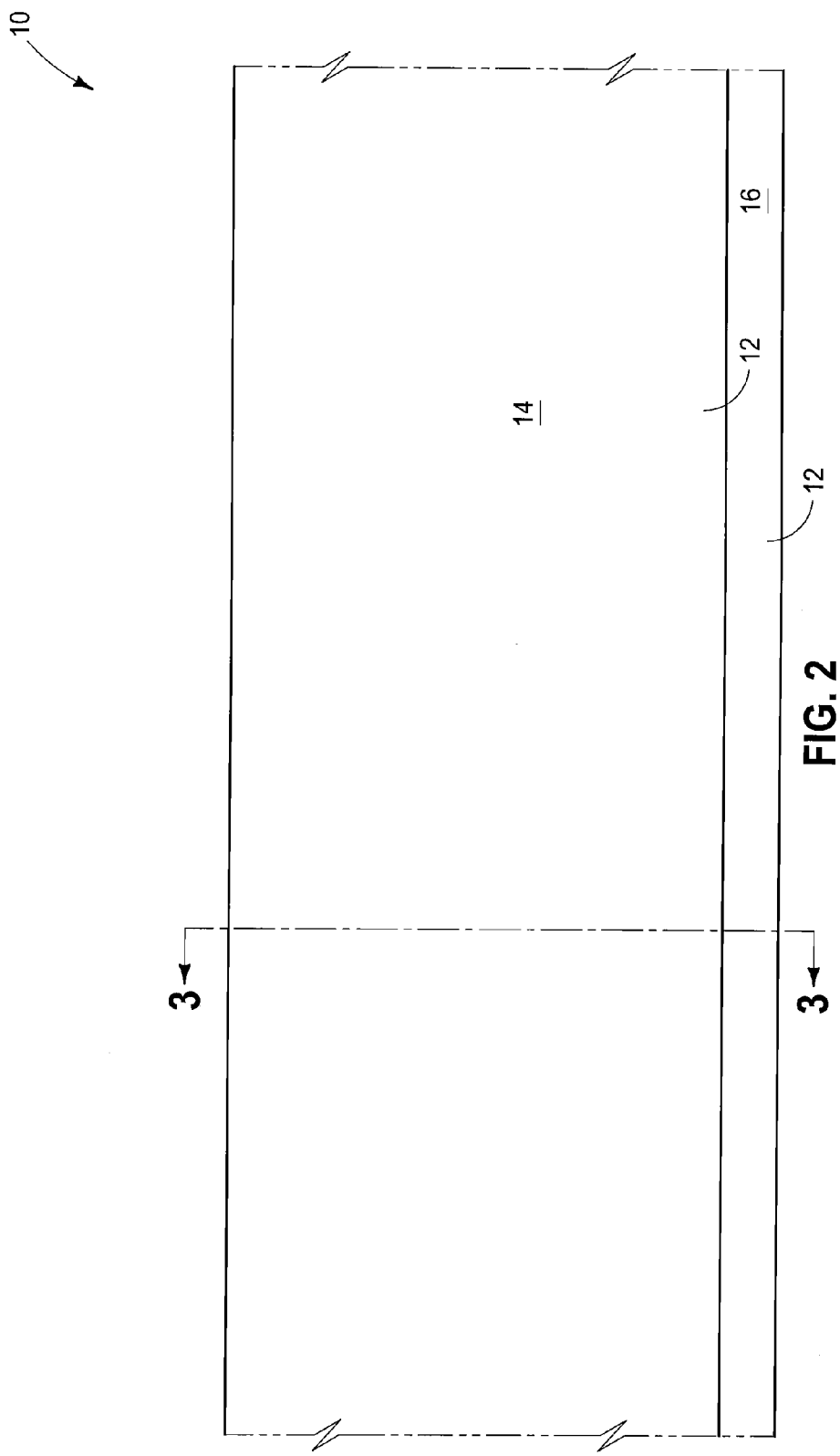
Figure 3:
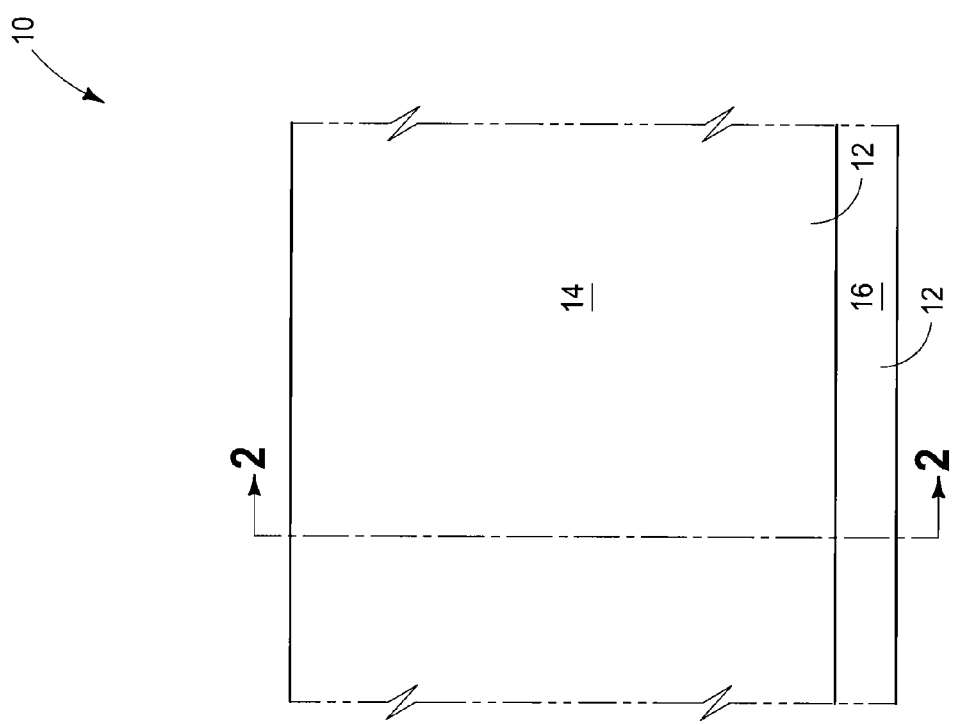

Referring to FIGS. 1-3, a portion of a semiconductor construction 10 is shown in top view (FIG. 1) and a pair of cross-sectional side views (FIGS. 2 and 3). The semiconductor construction comprises a semiconductor material 12 (shown in FIGS. 2 and 3). Such semiconductor material may be any suitable semiconductor material, and in some embodiments may comprise, consist essentially of, or consist of monocrystalline silicon. A doped region 14 is formed within the semiconductor material 12 by implanting suitable dopant into the semiconductor material. Ultimately, some of the doped region 14 will be incorporated into an emitter/collector region of a BJT. Accordingly, doped region 14 may be either n-type or p-type majority doped, depending on whether the BJT is a pnp device or an npn device. In some embodiments, the emitter/collector regions of a BJT may be referred to as being first type doped regions and the base region of a BJT be referred to as being a second type doped region (with one of the first and second types being p-type and the other being n-type); and accordingly doped region 14 may be referred to as being a first type doped region.

In an example embodiment, doped region 14 may be p-type doped by implanting boron into the region at a suitable dose (for instance, a dose within a range of from about $1\times10^{12}$ atoms/cm$^2$ to about $1\times10^{14}$ atoms/cm$^2$).

In some embodiments, some of the region 14 ultimately forms a collector region of a BJT, and in such embodiments region 14 may be referred to as a collector implant region.

The cross-sectional views of FIGS. 2 and 3 show a region 16 of semiconductor material 12 below region 14. The region 16 may be background p-type doped in some embodiments, in accordance with conventional semiconductor processing.

The semiconductor material 12 may be considered to be all or part of a semiconductor substrate in some embodiments. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Figure 4:
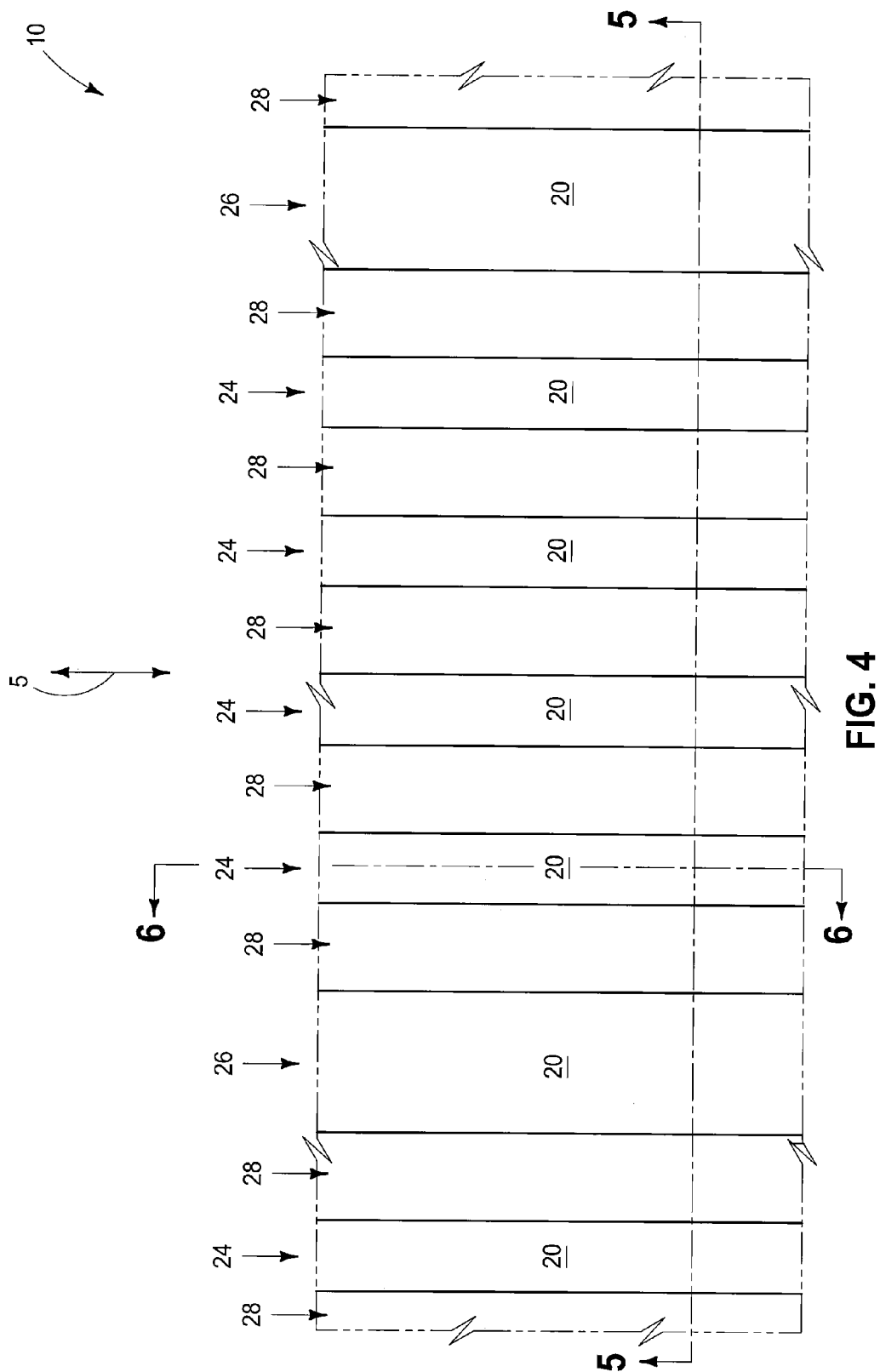
FIGS. 4-6 are a top view and cross-sectional side views of the semiconductor construction of FIGS. 1-3 at a processing stage subsequent to that of FIGS. 1-3. The cross-sectional view of FIG. 5 is along the lines 5-5 of FIGS. 4 and 6; and the cross-sectional view of FIG. 6 is along the lines 6-6 of FIGS. 4 and 5.
Figure 5:
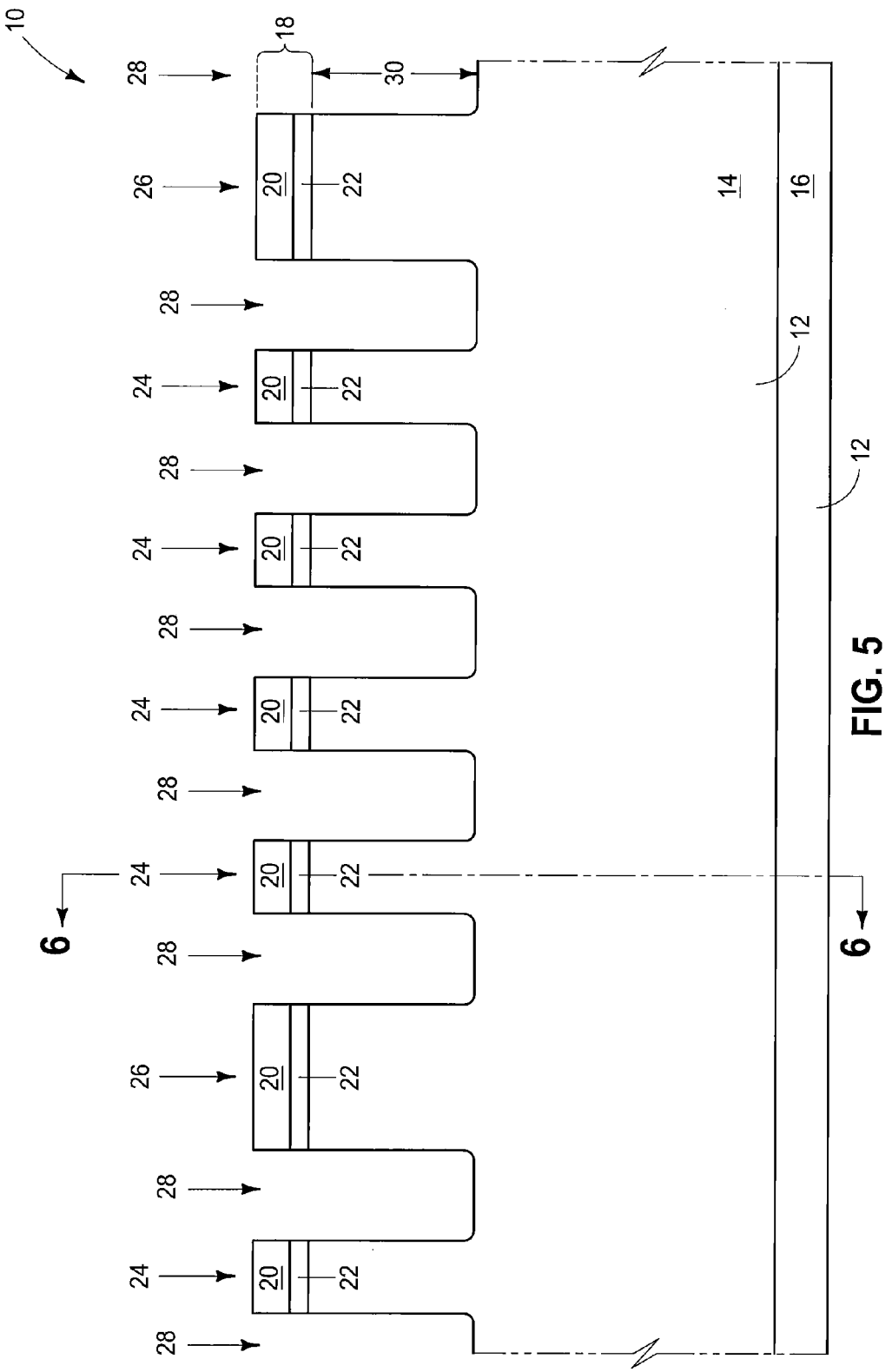
Figure 6:
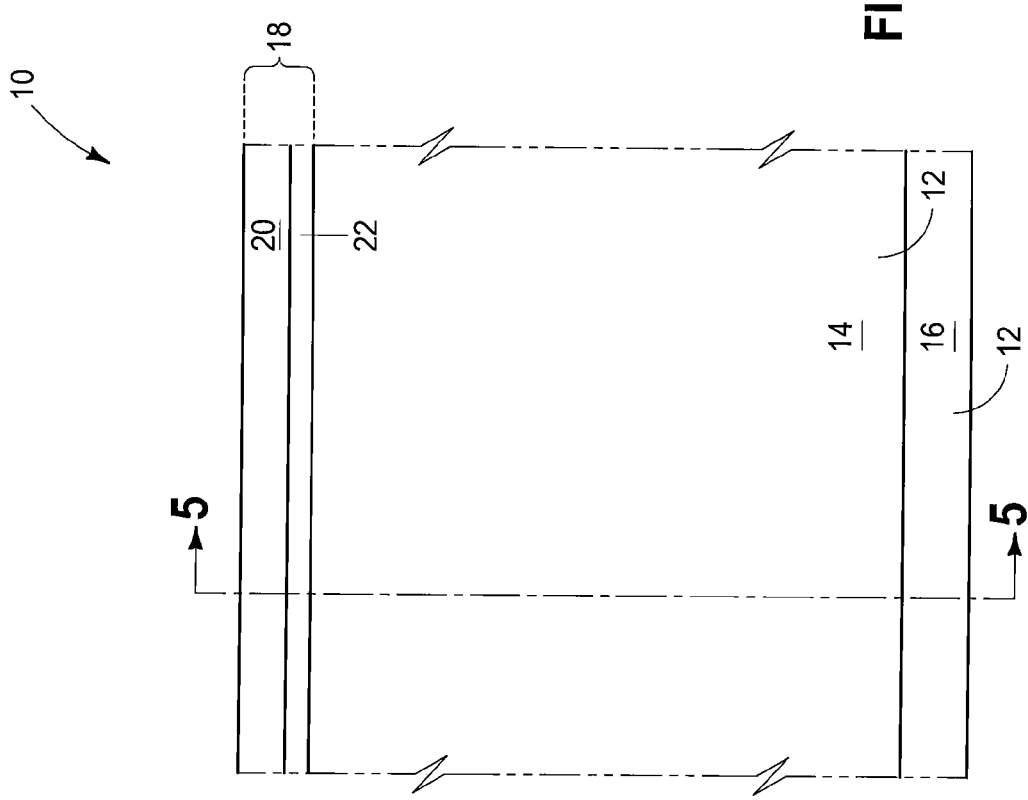

Referring to FIGS. 4-6, a patterned hard mask 18 is formed over doped region 14. The illustrated patterned hard mask comprises silicon nitride 20 over pad oxide 22. However, any suitable mask may be utilized. In some embodiments, the hard mask 18 may be patterned utilizing photolithographic processing. Specifically, materials 20 and 22 may be formed across an entirety of upper surface of doped region 14; patterned photoresist may be photolithographically formed over materials 20 and 22; a pattern transferred from the photoresist into materials 20 and 22 with one or more suitable etches; and then the photoresist removed to leave the patterned hard mask of FIGS. 4-6. In other embodiments, the patterned hard mask may be formed utilizing pitch-multiplication methodologies, or any other suitable methodologies either now known or yet to be developed.

Figure 24:
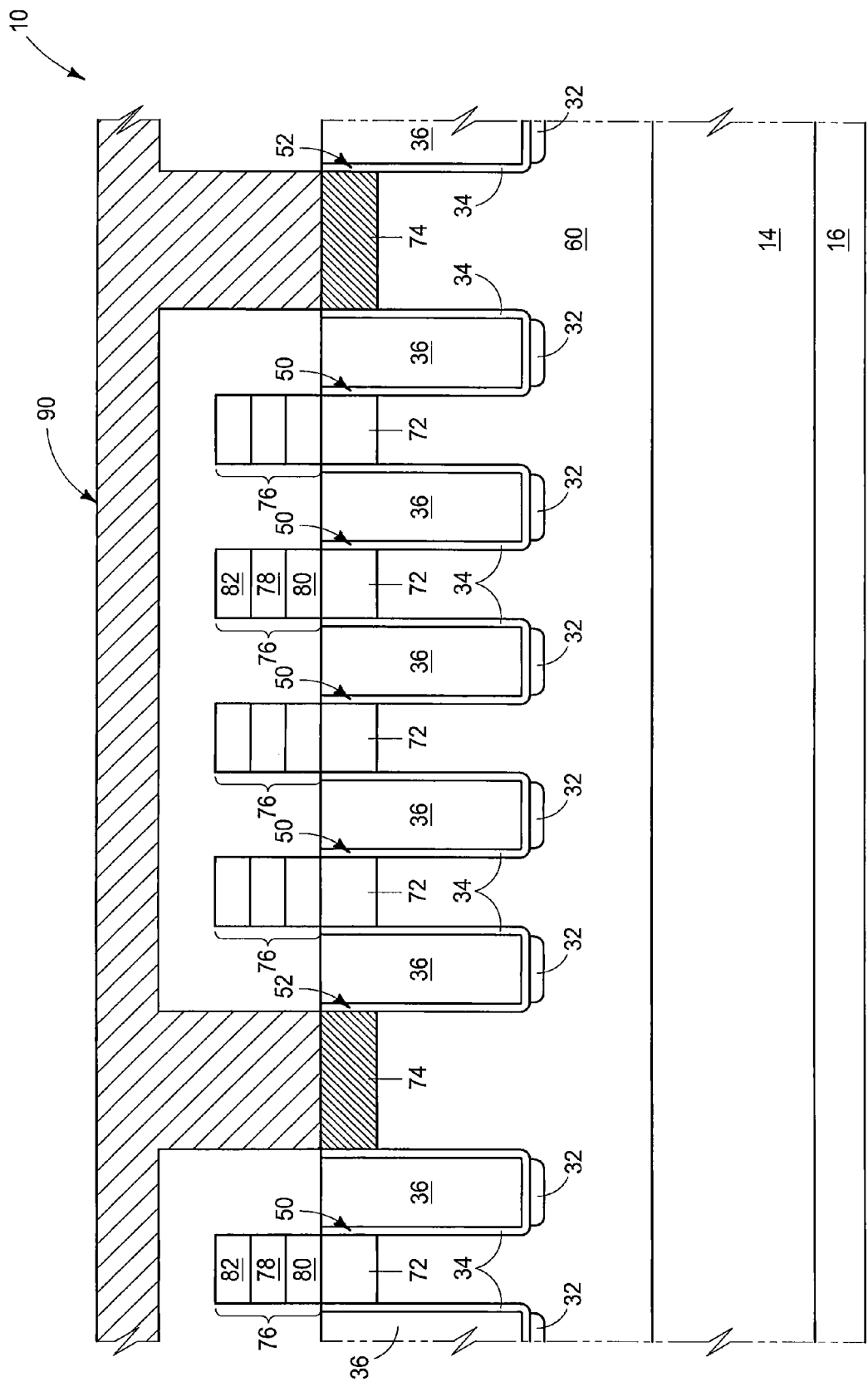

In the shown embodiment, the patterned hard mask comprises narrow features 24 and wide features 26. Ultimately, the narrow features pattern BJT select devices of a memory array and the wide features pattern contacts to a base region of the BJT devices, as shown in FIG. 24. In the shown example embodiment of FIGS. 4-6, there are four narrow regions 24 between two wide regions 26. Other embodiments may have a different ratio of narrow regions to wide regions; and some embodiments may have a different configuration of BJT devices so that the wide regions are eliminated altogether or replaced by other material.

A pattern from mask 18 is transferred into region 14 with one or more suitable etches to form trenches 28. The trenches 28 may be referred to as first trenches to distinguish them from other trenches which are subsequently formed. The first trenches extend along a direction indicated by axis 5 (shown in the top view of FIG. 4). Such direction may be referred to as a first direction.

The trenches 28 extend to a depth 30 within region 14, and such depth may be referred to as a first depth to distinguish it from a depth of other trenches which are subsequently formed.

Figure 7:
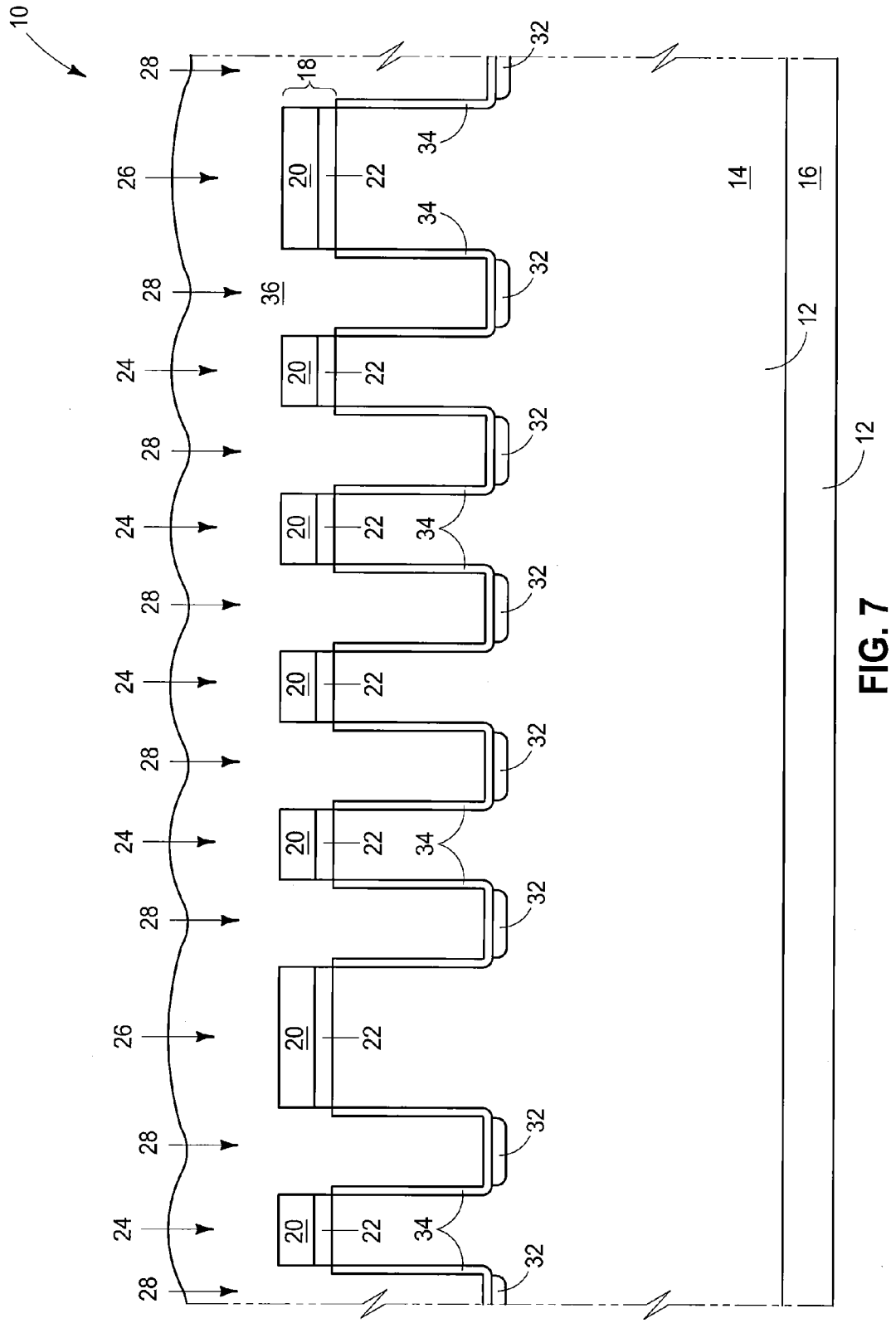
FIG. 7 is view along the cross-section of FIG. 5 at a processing stage subsequent to that of FIG. 5.

FIG. 7 shows the construction 10 along the same cross-section as FIG. 5, but at a processing stage subsequent to that of FIG. 5. Liners 34 of electrically insulative material are formed along sidewalls of trenches 28. In some embodiments, semiconductor material 12 may comprise, consist essentially of, or consist of silicon; and liners 34 may comprise, consist essentially of, or consist of silicon dioxide thermally grown from such silicon. Although the liners are shown being formed only along semiconductor material 12, in other embodiments the processing utilized to form the liners may also form regions of the liners along sidewalls of the hard mask 18.

Doped regions 32 are formed within semiconductor material 12 at the bottoms of trenches 28. The doped regions 32 comprise an opposite type dopant relative to the doped region 14. Accordingly, if doped region 14 is p-type doped, then regions 32 are n-type doped; and vice versa. The regions 32 may be considered to comprise reinforcement doping, and specifically reinforce doping of a base implant (described below with reference to FIGS. 17-19) along the bottoms of trenches 28. In some example embodiments, regions 32 are n-type doped; and are formed by implanting one or more n-type species (for instance, arsenic) at a suitable dose (for instance, a dose within a range of from about $1 \times 10^{13}$ atoms/$cm^2$ to about $1 \times 10^{15}$ atoms/$cm^2$).

The liners 34 may be provided before or after implanting of the doped regions 32. In some embodiments, it may be advantageous to form the liners 34 prior to formation of doped regions 32 to protect portions of region 14 that would otherwise be exposed during the implant of the dopant.

Electrically insulative material 36 is formed within the lined trenches 28. Material 36 may comprise any suitable composition; and may, for example, comprise, consist essentially of, or consist of one or both of silicon dioxide and silicon nitride. In some embodiments, the material 36 may comprise low density silicon dioxide. The liners 34 and material 36 together fill the trenches 28. The electrically insulative material filling trenches 28 may be referred to as first electrically insulative material to distinguish it from another insulative material that will be utilized to fill other trenches (discussed below with reference to FIGS. 14-16).

Figure 8:
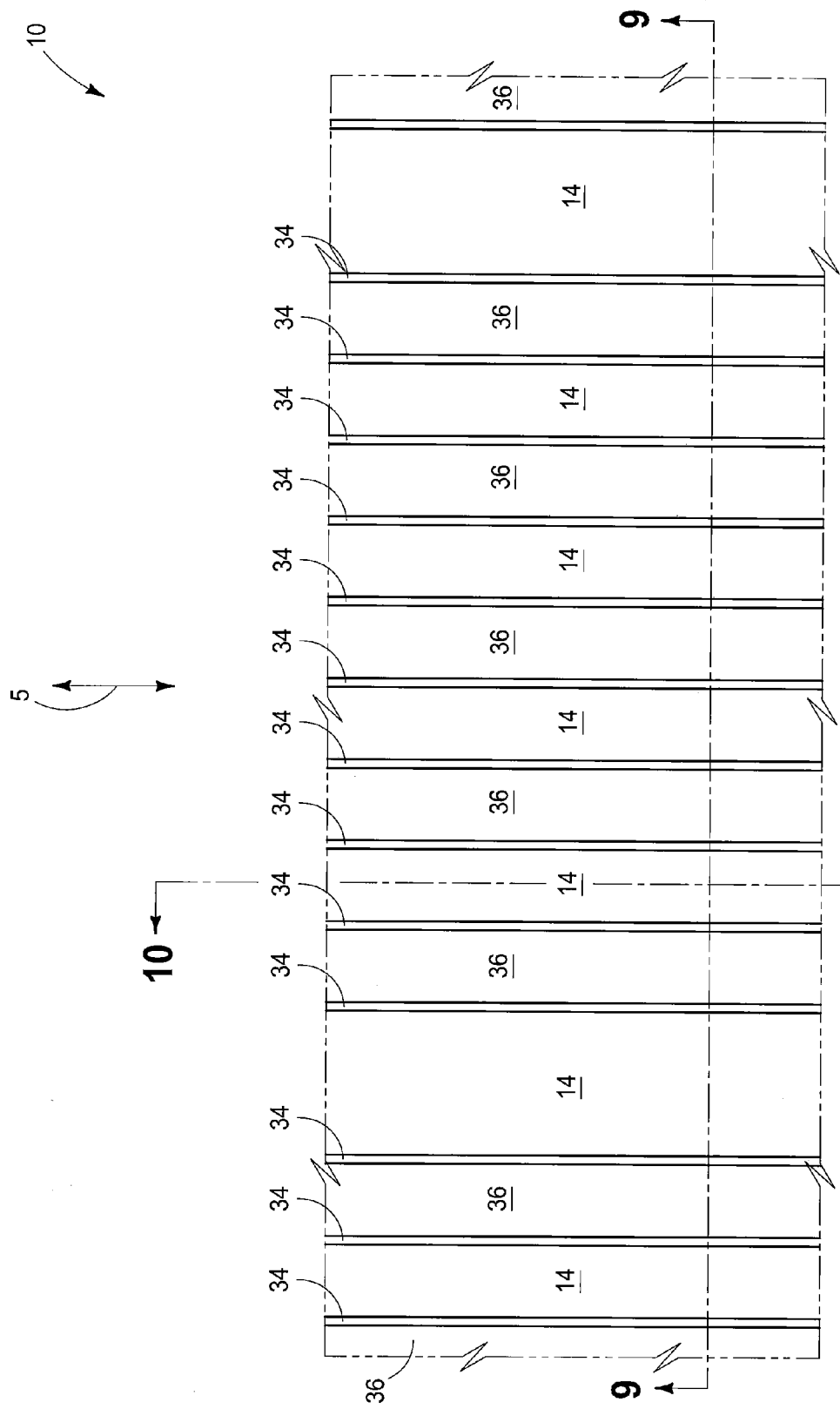
FIGS. 8-10 are a top view and cross-sectional side views of the semiconductor construction of FIGS. 1-3 at a processing stage subsequent to that of FIG. 7. The cross-sectional view of FIG. 9 is along the lines 9-9 of FIGS. 8 and 10; and the cross-sectional view of FIG. 10 is along the lines 10-10 of FIGS. 8 and 9.
Figure 9:
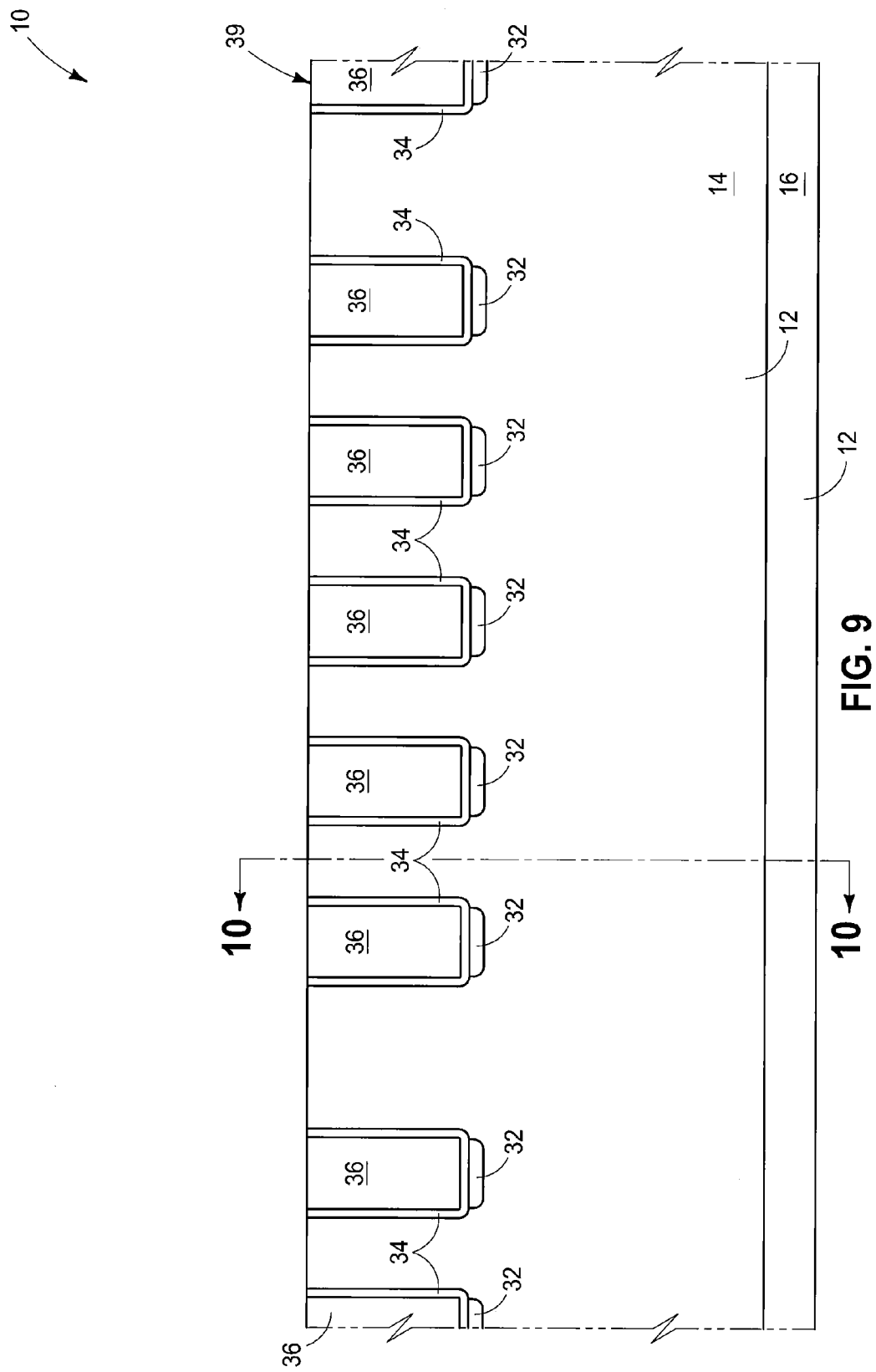
Figure 10:
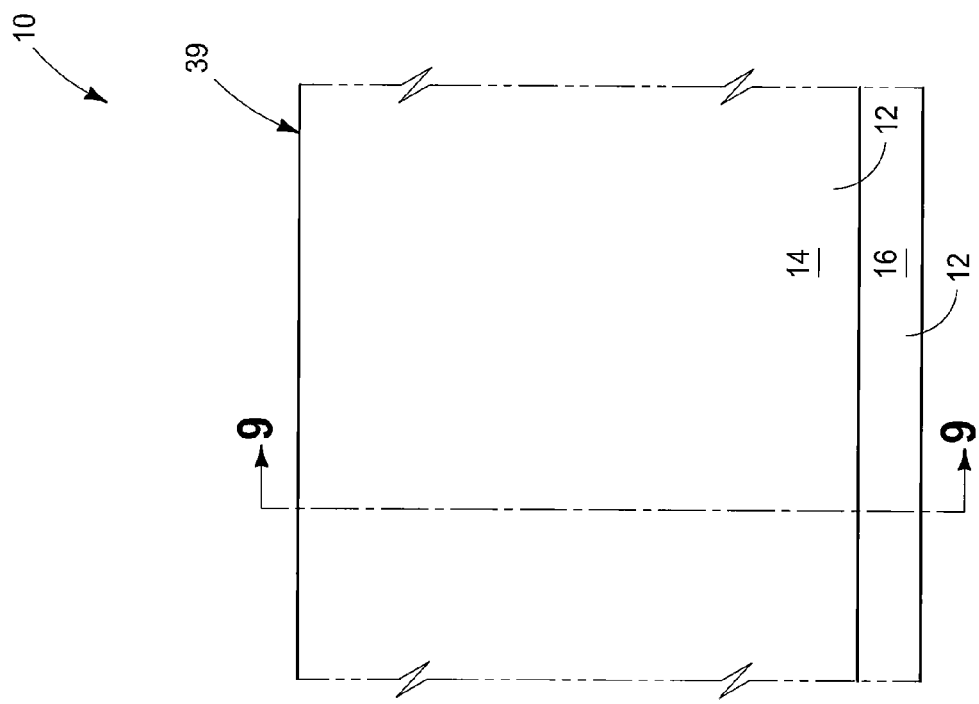

Referring to FIGS. 8-10, construction 10 is subjected to planarization, such as chemical-mechanical polishing (CMP), to form a planarized surface 39 extending across liners 34, material 36, and the doped region 14. In the shown embodiment, the planarization removes masking material 18 (FIG. 7). In other embodiments, masking material 18 may remain after the planarization.

Figure 11:
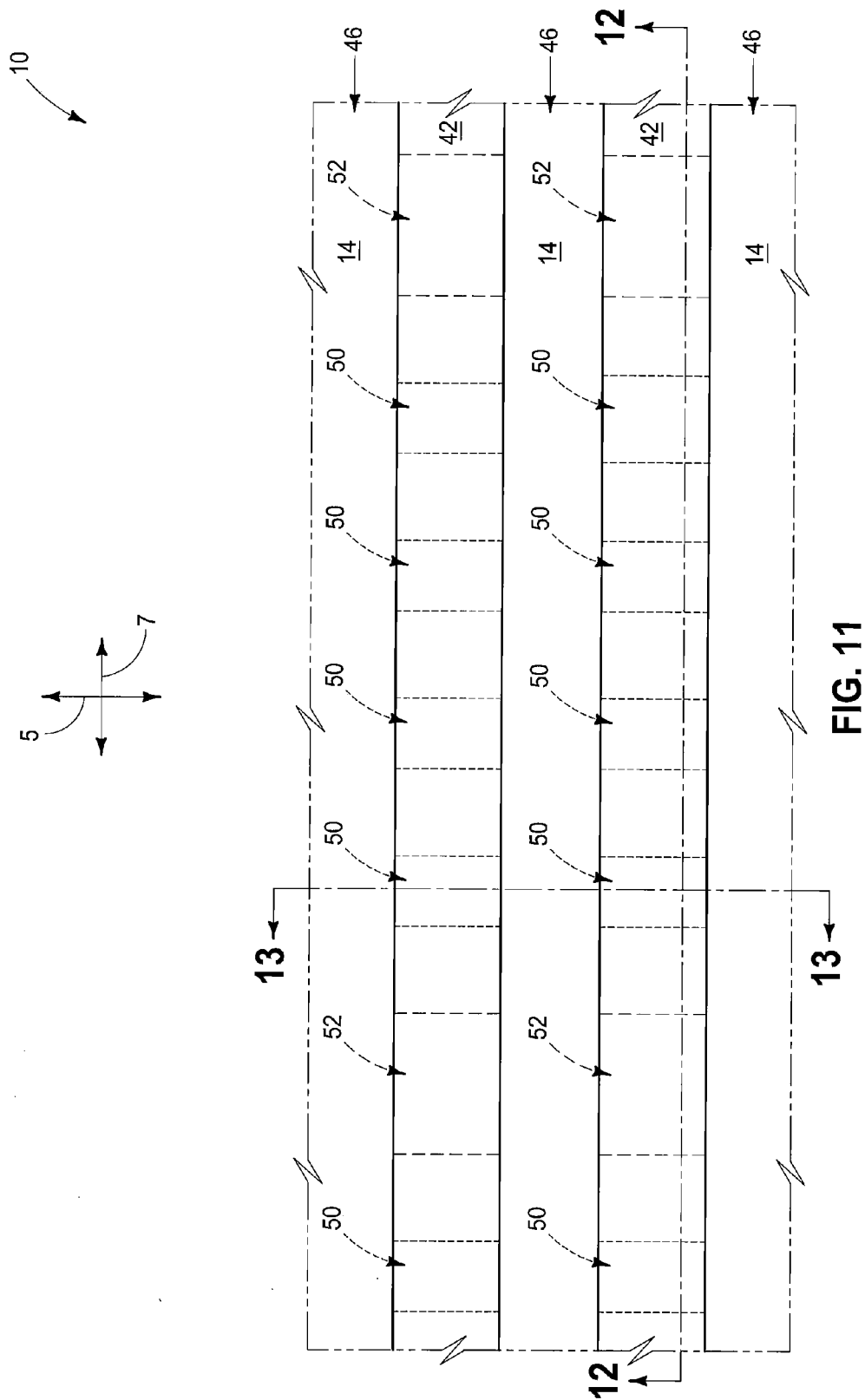
FIGS. 11-13 are a top view and cross-sectional side views of the semiconductor construction of FIGS. 1-3 at a processing stage subsequent to that of FIGS. 8-10. The cross-sectional view of FIG. 12 is along the lines 12-12 of FIGS. 11 and 13; and the cross-sectional view of FIG. 13 is along the lines 13-13 of FIGS. 11 and 12.
Figure 12:
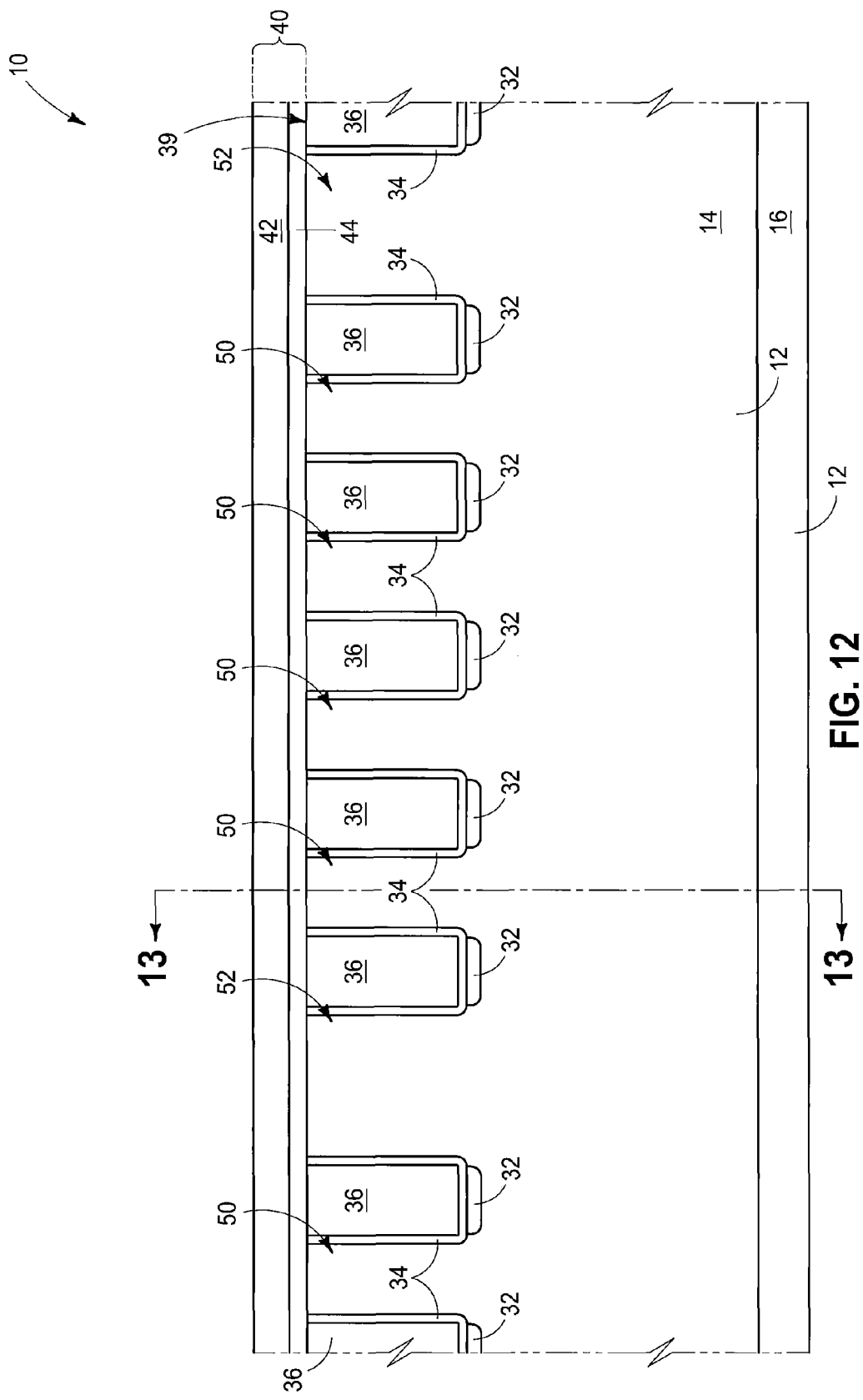
Figure 13:
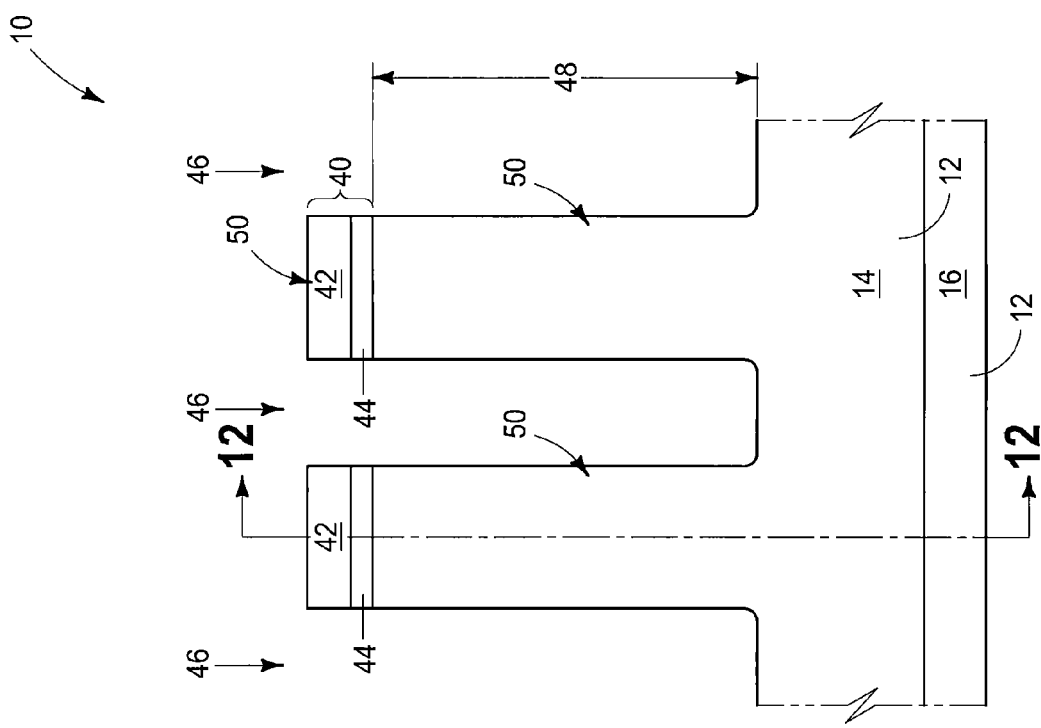

Referring to FIGS. 11-13, a patterned hard mask 40 is formed over planarized surface 39. The illustrated patterned hard mask comprises silicon nitride 42 over pad oxide 44. However, any suitable mask may be utilized. The hard mask 40 may be patterned utilizing any suitable methodologies; including, for example any of the methodologies discussed above for fabrication of hard mask 18 of FIGS. 4-6.

Trenches 46 have been extended into doped region 14 by transferring a pattern from mask 40 into region 14 with one or more suitable etches. The trenches 46 may be referred to as second trenches to distinguish them from the first trenches 28 of FIGS. 4-6. The second trenches extend along a direction indicated by axis 7 (shown in the top view of FIG. 11). The direction of axis 7 may be referred to as a second direction, and such direction intersects the first direction of axis 5 (in the shown embodiment, the second direction of axis 7 is substantially orthogonal to the first direction of axis 5).

The trenches 46 extend to a depth 48 within region 14, and such depth may be referred to as a second depth to distinguish it from the depth 30 of the first trenches 28 (FIG. 5). The second depth 48 is deeper than the first depth 30. The second depth 48 extends into doped region 14, but does not penetrate entirely through the doped region.

Although the deep trenches 46 are shown formed after the shallow trenches 28, in other embodiments the order of formation of trenches 46 relative to trenches 28 may be reversed. Accordingly, the so-called "second" trenches 48 may be formed prior to the so-called "first" trenches 28 in some embodiments.

The intersecting trenches 28 (FIGS. 4-6) and 46 (FIGS. 11-13) pattern a plurality of pedestals 50 and 52 from semiconductor material 12. Such pedestals are shown in dashed-line (i.e., phantom) view in the top view of FIG. 11 to indicate that they are beneath masking material 42. The pedestals 52 are wider than the pedestals 50 along the direction of axis 7. The pedestals 50 are ultimately incorporated into BJT devices, and may be referred to as BJT pillars in the discussion that follows.

Figure 14:
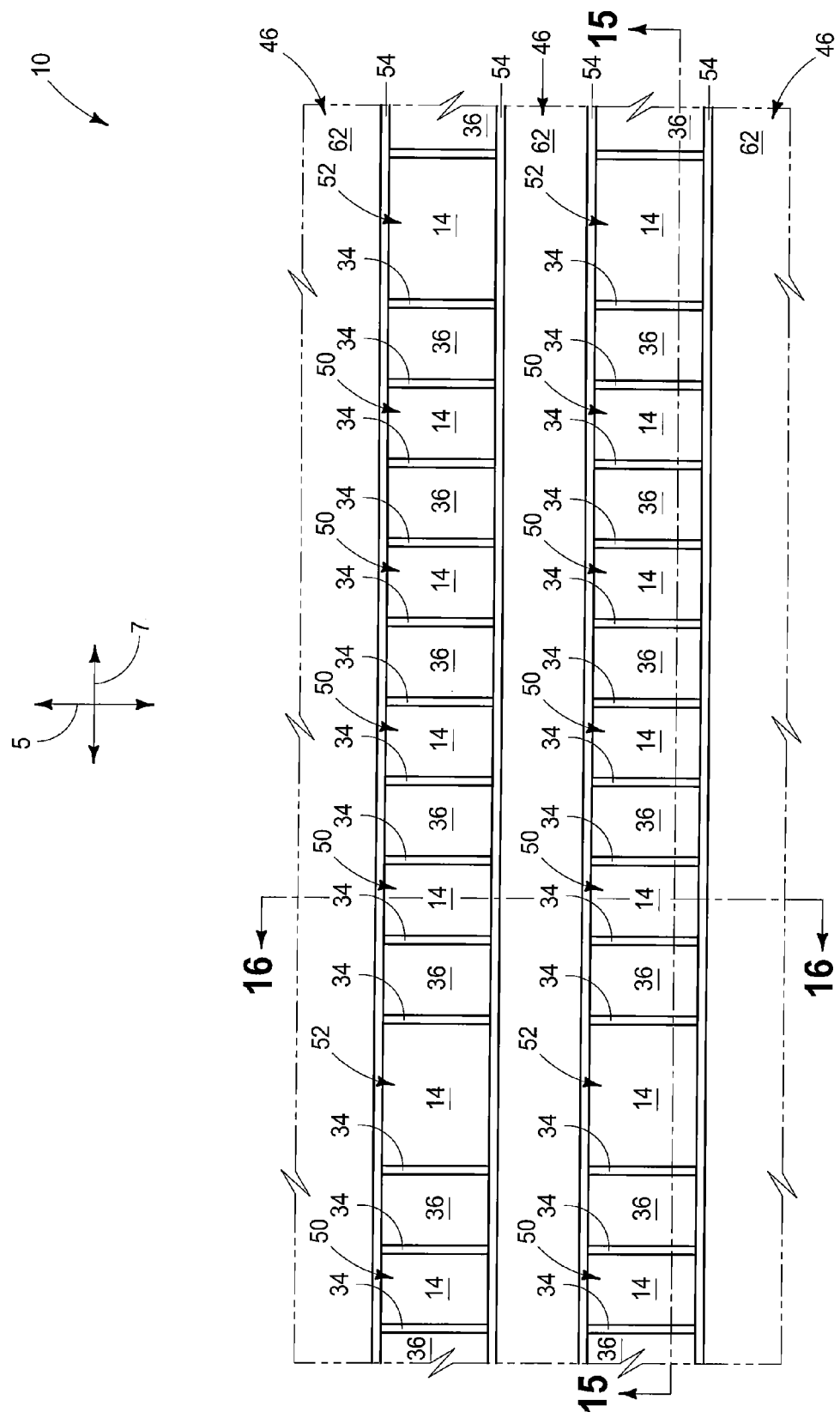
FIGS. 14-16 are a top view and cross-sectional side views of the semiconductor construction of FIGS. 1-3 at a processing stage subsequent to that of FIGS. 11-13. The cross-sectional view of FIG. 15 is along the lines 15-15 of FIGS. 14 and 16; and the cross-sectional view of FIG. 16 is along the lines 16-16 of FIGS. 14 and 15.
Figure 15:
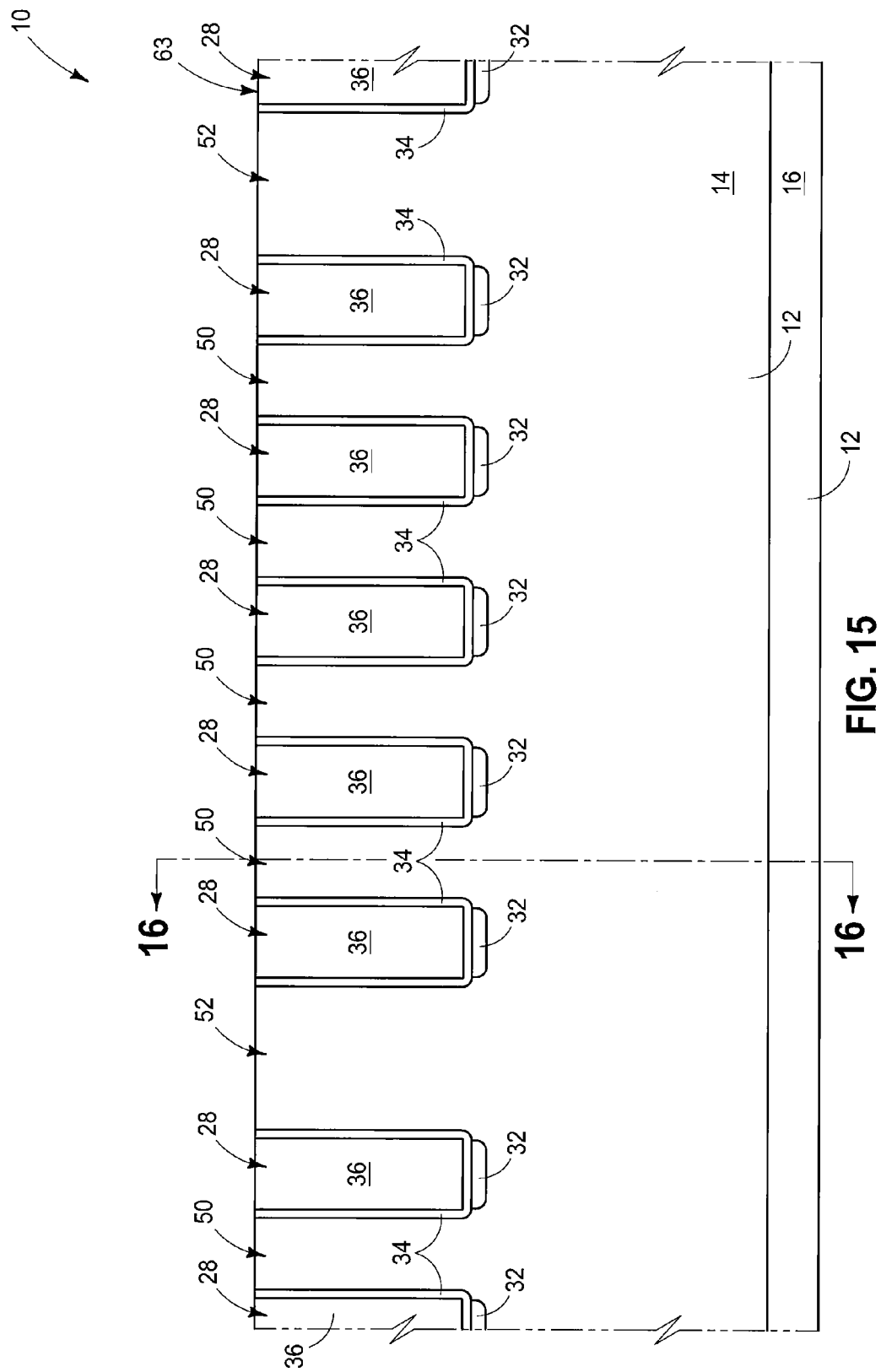
Figure 16:
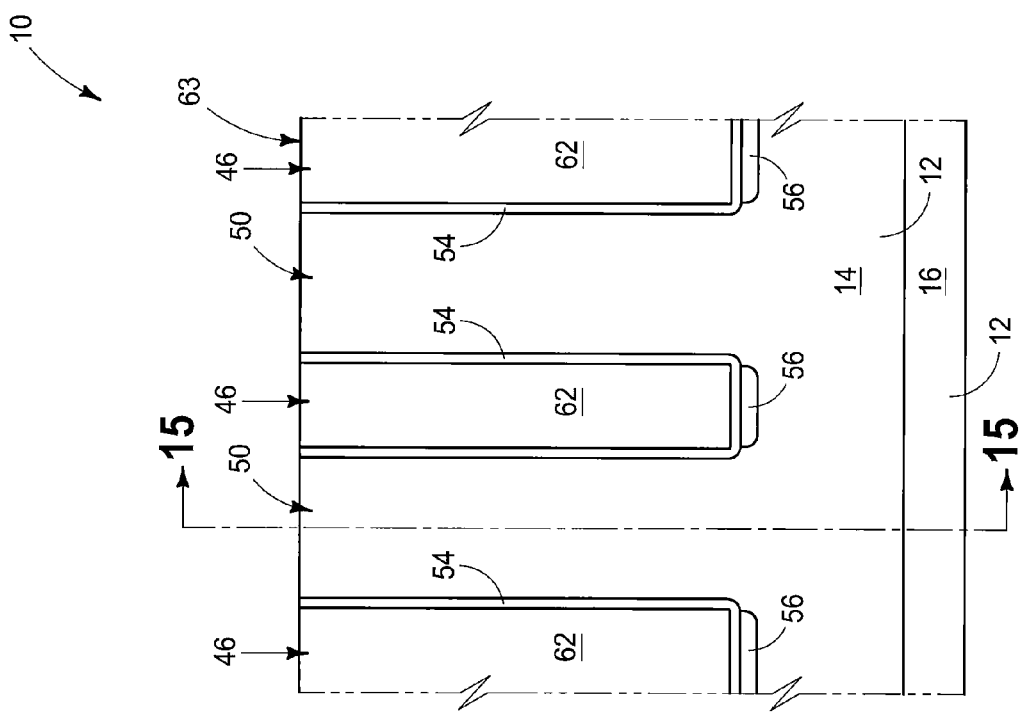

Referring to FIGS. 14-16, liners 54 of electrically insulative material are formed along sidewalls of trenches 46, and electrically insulative material 62 is formed within the lined trenches 46. In some embodiments, semiconductor material 12 may comprise, consist essentially of, or consist of silicon; and liners 54 may comprise, consist essentially of, or consist of silicon dioxide thermally grown from such silicon.

The electrically insulative material 62 may comprise any suitable composition; including, for example, one or more of the compositions discussed above relative to material 36. In some embodiments, materials 62 and 36 may comprise a same composition as one another, and in other embodiments materials 62 and 36 may comprise different compositions relative to one another. The liners 54 and material 62 together fill the trenches 46. The electrically insulative material filling trenches 46 may be referred to as second electrically insulative material to distinguish it from the first insulative material filling trenches 28 (discussed above with reference to FIG. 7).

FIGS. 14-16 show construction 10 after planarization, such as CMP, has been utilized to form a planarized surface 63 extending across liners 34 and 54, insulative materials 36 and 62, and the region 14. Such CMP has removed the mask 40 (FIGS. 11-13) in the shown embodiment.

Doped regions 56 are formed within semiconductor material 12 at the bottoms of trenches 46. The doped regions 56 comprise a same type dopant relative to the doped region 14. Accordingly, if doped region 14 is p-type doped, then regions 56 are also p-type doped. The regions 56 may be considered to comprise reinforcement doping, and specifically may reinforce doping of a collector implant along the bottoms of trenches 46. In some example embodiments, regions 56 are p-type doped; and are formed by implanting one or more suitable p-type species (for instance, boron) at a suitable dose (for instance, boron may be implanted at a dose within a range of from about $1 \times 10^{12}$ atoms/cm$^2$ to about $2 \times 10^{14}$ atoms/cm$^2$).

The liners 54 may be provided before or after implanting of the doped regions 56. In some embodiments, it may be advantageous to form the liners 54 prior to formation of doped regions 56 to protect surfaces that would otherwise be exposed during the implant of the dopant. The insulative material 62 is provided within trenches 46 after formation of doped regions 56.

Figure 17:
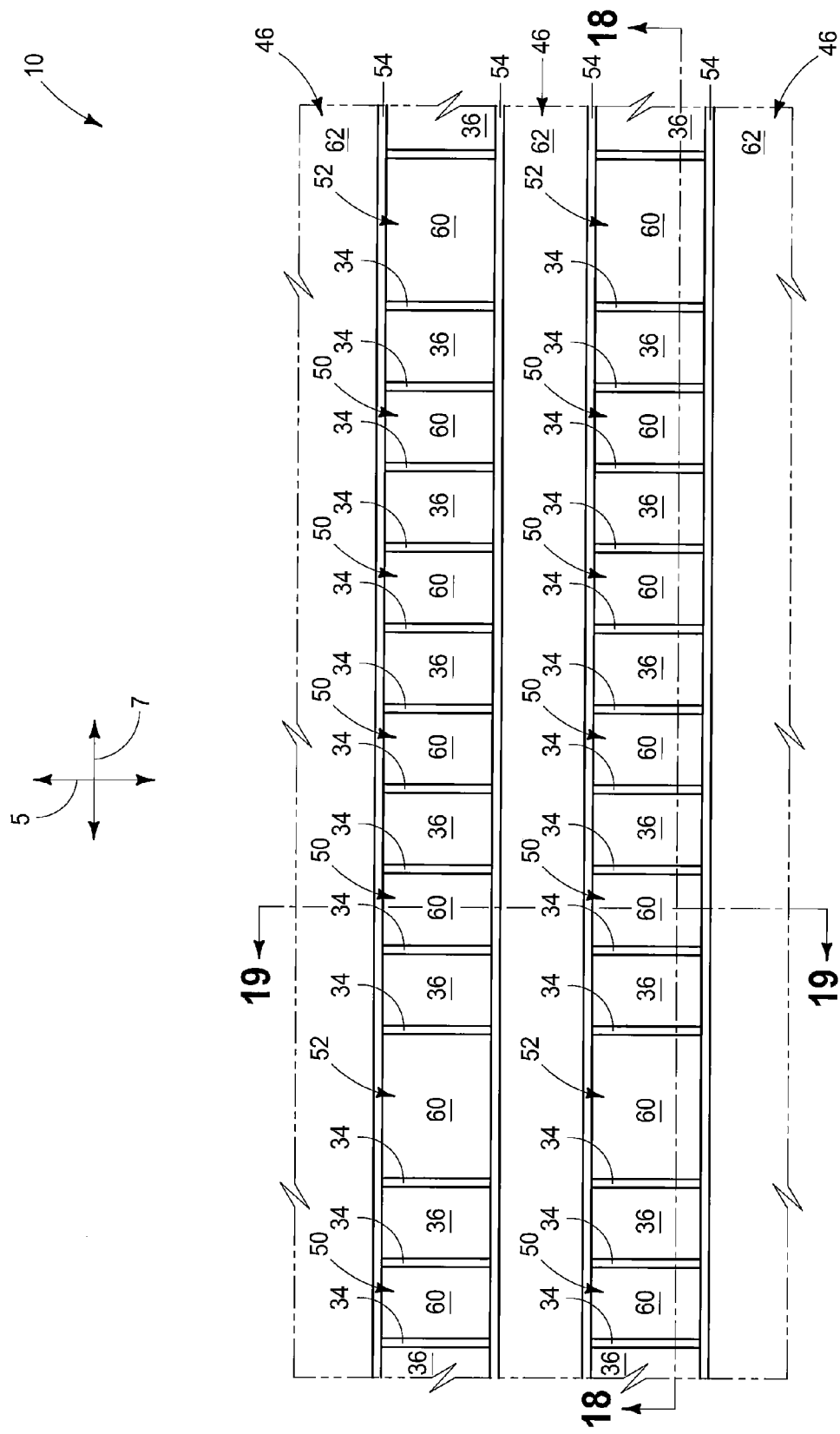
FIGS. 17-19 are a top view and cross-sectional side views of the semiconductor construction of FIGS. 1-3 at a processing stage subsequent to that of FIGS. 14-16. The cross-sectional view of FIG. 18 is along the lines 18-18 of FIGS. 17 and 19; and the cross-sectional view of FIG. 19 is along the lines 19-19 of FIGS. 17 and 18.
Figure 18:
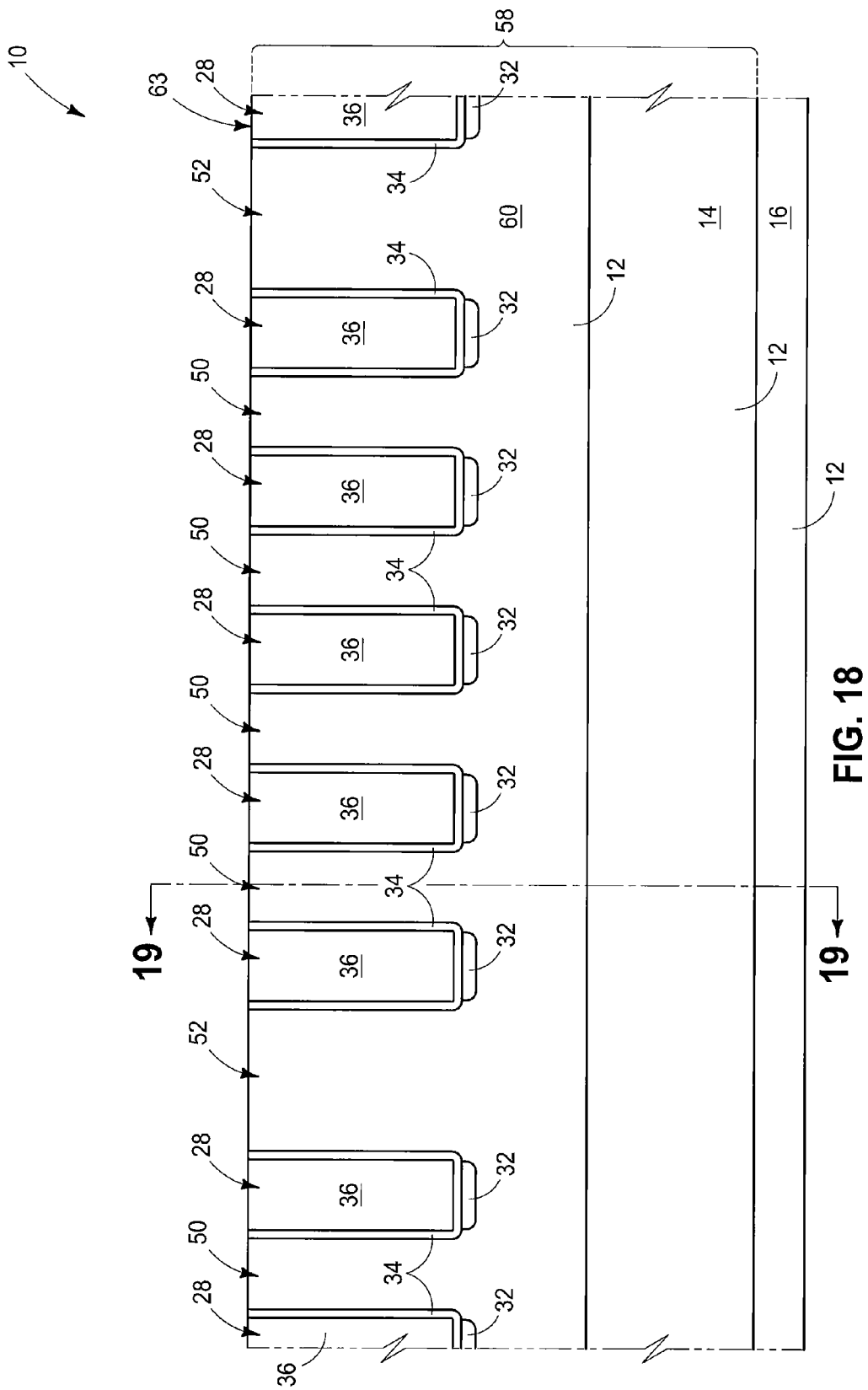
Figure 19:
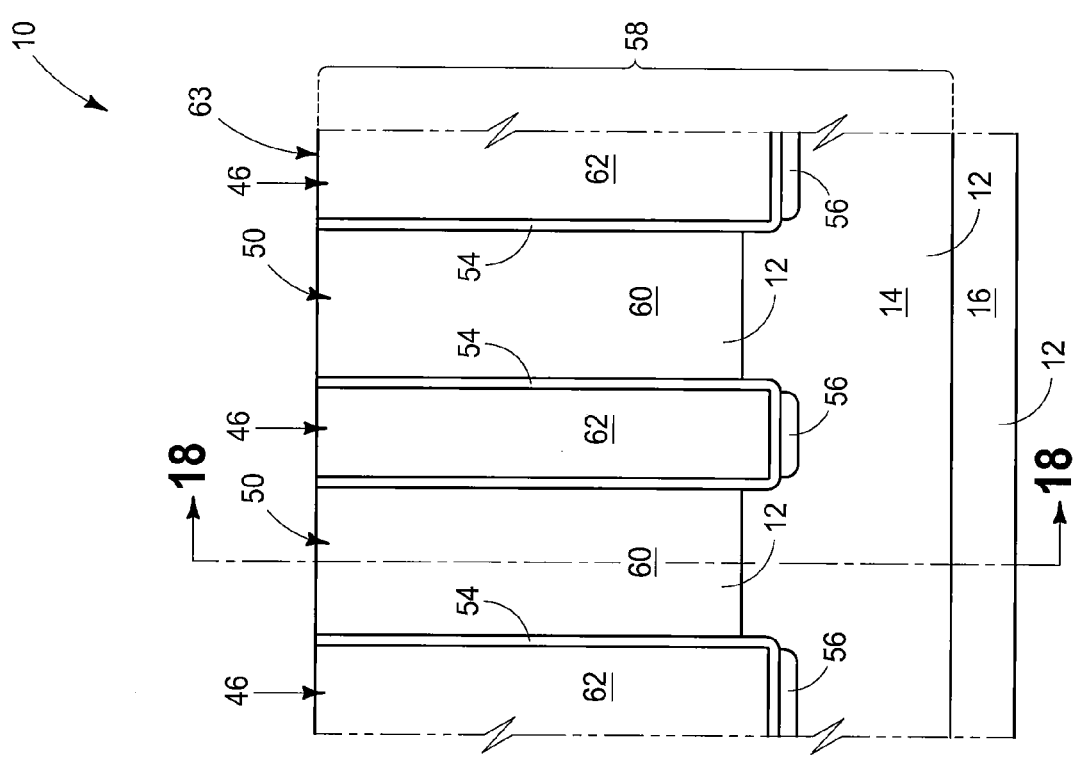

Referring to FIGS. 17-19, an upper portion of doped region 14 is counter-doped to form a stack 58 comprising a second type doped region 60 over the first type doped region 14. The doped region 60 will ultimately be incorporated into a base region of a BJT. Accordingly, doped region 60 may be either n-type or p-type majority doped, depending on whether the BJT is a pnp device or an npn device. In an example embodiment, doped region 60 may be n-type doped by implanting one or more suitable n-type species (for instance, arsenic) at a suitable dose (for instance, a dose within a range of from about $1 \times 10^{12}$ atoms/cm$^2$ to about $1 \times 10^{14}$ atoms/cm$^2$).

The embodiment of FIGS. 1-19 differs from conventional methods of forming BJT select devices in that the implant of dopant to form base region 60 occurs after formation of pedestals 50 and 52 rather than prior to formation of such pedestals. In conventional methods, the base region implant is conducted into unpatterned silicon (i.e., the base region implant is conducted prior to formation of trenches analogous to the trenches 28 and 46). Accordingly, about ¼ of the dose may be implanted into areas later removed and replaced with insulative material (specifically, field oxide). Additionally, the useful dose in the BJT pillars out-diffuses to liners and to undoped field oxide during thermal processing (the partial pressure of the implanted species favors out-diffusion into the insulative materials), so the effective base region dose remaining in the BJT pillars is further diminished. In contrast, the embodiment of FIGS. 1-19 comprises implanting the base region dose into BJT pillars; and further comprises conducting such implant after formation of liners and insulative material adjacent the pillars. The implant into the pillars and adjacent insulative material provides an equilibrium of dopant across the silicon of the pillars and the compositions of the insulative material, and thus the partial pressure of implanted species does not favor out-diffusion from silicon to insulative material. Accordingly, the effective dose may remain in the BJT pillars.

In some embodiments, the base implant region may be subjected to a lower thermal budget relative to a base implant region formed by conventional methods, in that some embodiments described herein complete any thermal processing associated with formation of isolation regions within trenches 28 and 46 prior to forming the base implant region. In this way, out-diffusion of base doping from silicon to insulative material may be reduced.

In some embodiments, the processing of FIGS. 1-19 may utilize substantially less dopant for forming the base region than is utilized by prior art processing. In some embodiments, the dose utilized to form base region 60 is about half of the dose utilized in conventional methods. Such not only reduces costs by utilizing less dopant, but also may reduce defect formation relative to conventional methods. Specifically, higher dopant doses often lead to more defects (such as dislocations) than lower doses, and accordingly the lower base region implant dose utilized in methods of the present invention may reduce defects as compared to the high doses utilized in conventional methods. Further, the patterned silicon may act as a sink for defects that may be induced by the base region implant to thereby alleviate propagation of dislocations.

In some embodiments, structures formed utilizing embodiments of the present invention may be discerned from structures formed with conventional processing by the amount of base region dopant present in the insulative regions of the construction (specifically, the insulative materials present in trenches 28 and 46). Prior art constructions comprise very little base region dopant in the insulative regions (less than $5 \times 10^{16}$ atoms/cm$^3$) due to the base region implant being conducted prior to forming the insulative material. In contrast, constructions formed by example methods of the present invention may have the base region implant conducted after forming the insulative materials, and may thus have the base region dopant present to a same concentration within the insulative materials present in trenches 28 and 46 as in the semiconductor material 12 of the pillars 50 and 52. In some embodiments, base region dopant may be present to a concentration greater than about $7 \times 10^{16}$ atoms/cm$^3$ within the insulative materials present in trenches 28 and 46. In some embodiments, the base region dopant may be present in the electrically insulative material to a concentration within a range of from about $7 \times 10^{16}$ atoms/cm$^3$ to about $7 \times 10^{18}$ atoms/cm$^3$. In some embodiments, the base implant dopant provided within the insulative materials present in trenches 28 and 46 may be uniformly distributed within such insulative materials to about a same depth as the bottom of the base region 60 within semiconductor material 12.

In the shown embodiment, the first trenches 28 extend into the region 60, but do not extend entirely through the region 60; and the second trenches 46 penetrate entirely through the region 60. The depths of trenches 28 and 46 may be any suitable depths suitable for fabrication of BJT devices; and in some embodiments may be conventional depths utilized for fabrication of BJT devices. Similarly, the depths of implant regions 14 and 60 may be any suitable depths suitable for fabrication of BJT devices; and in some embodiments may be conventional depths utilized for fabrication of BJT devices.

Figure 20:
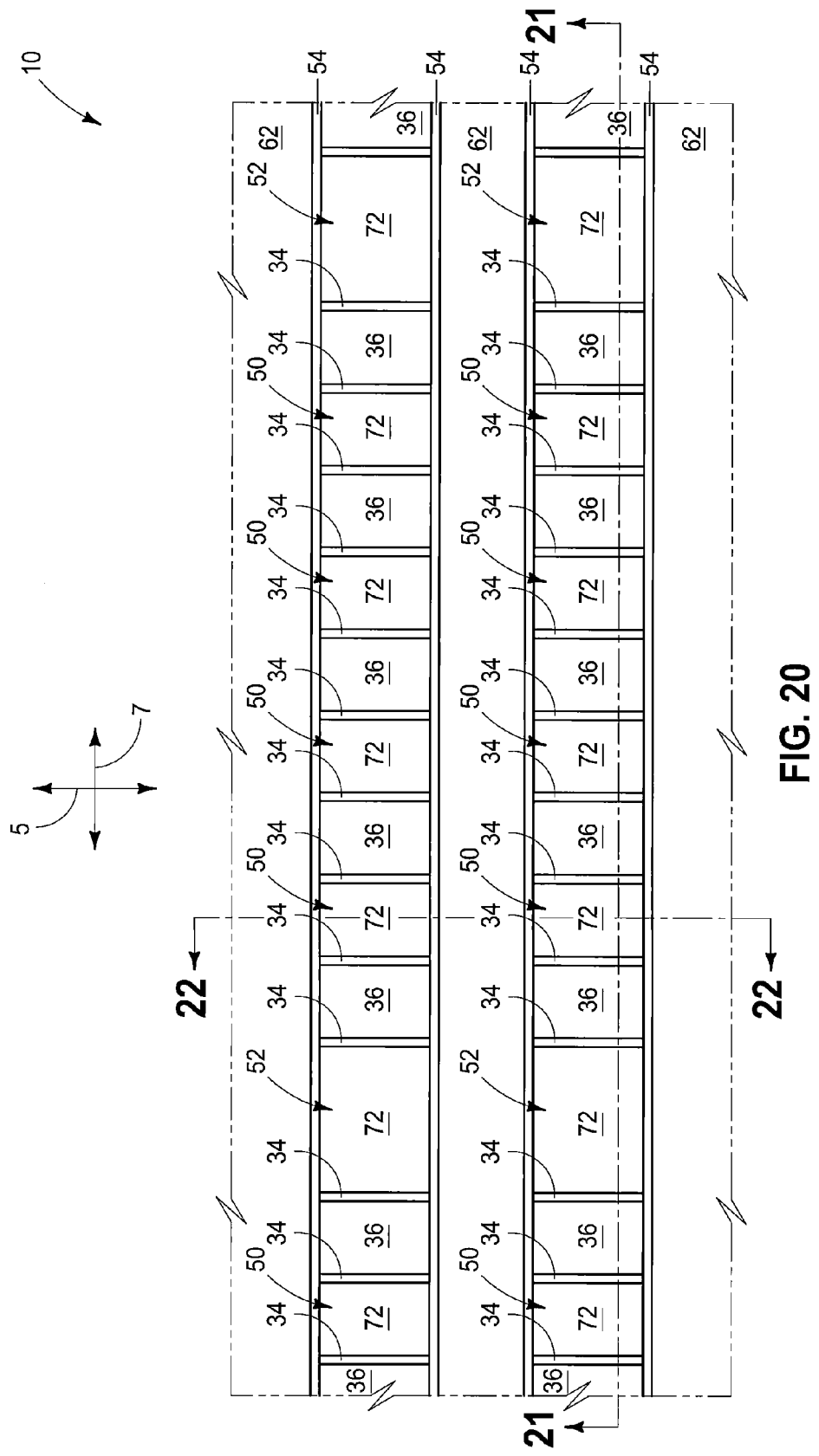
FIGS. 20-22 are a top view and cross-sectional side views of the semiconductor construction of FIGS. 1-3 at a processing stage subsequent to that of FIGS. 17-19. The cross-sectional view of FIG. 21 is along the lines 21-21 of FIGS. 20 and 22; and the cross-sectional view of FIG. 22 is along the lines 22-22 of FIGS. 20 and 21.
Figure 21:
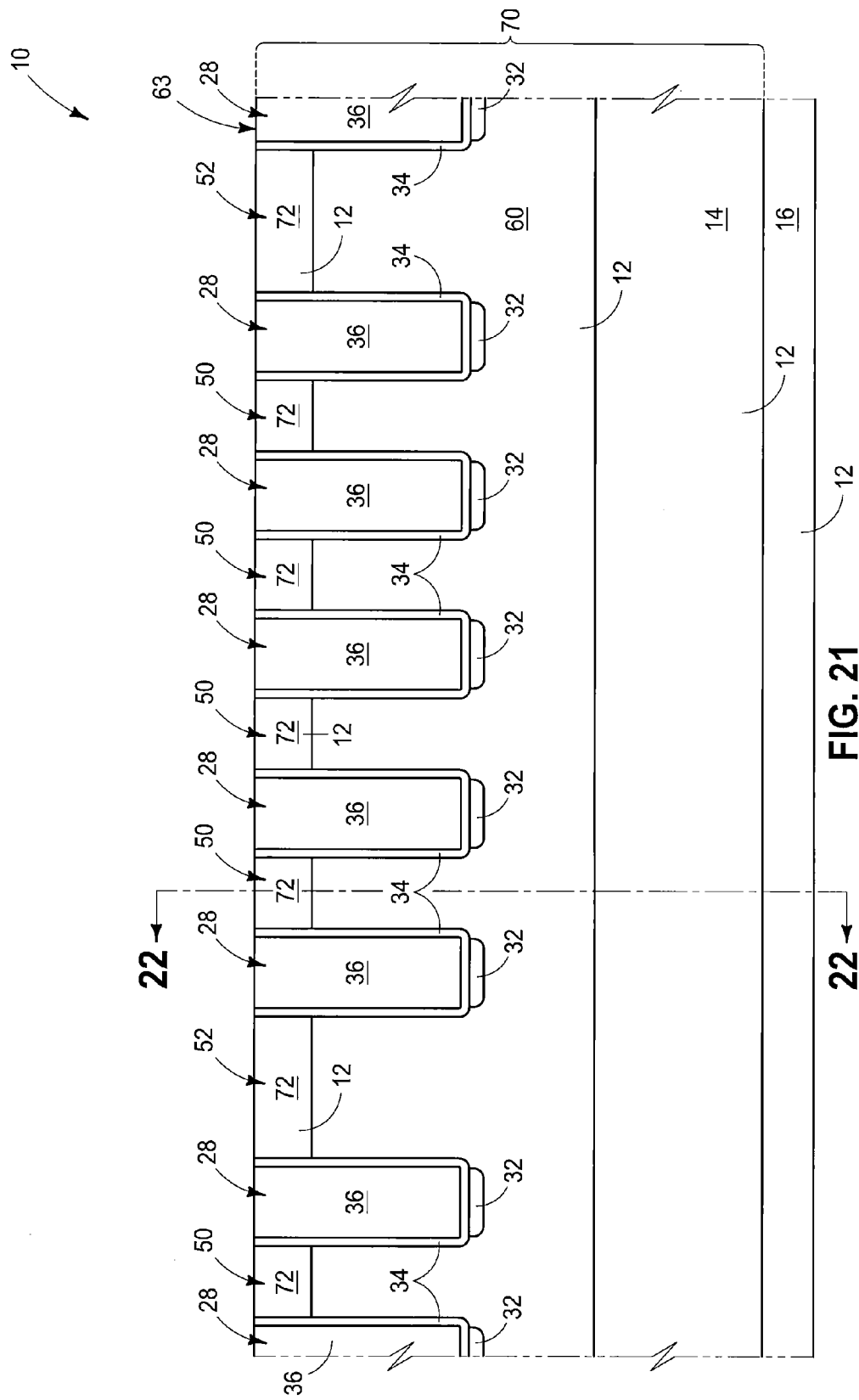
Figure 22:
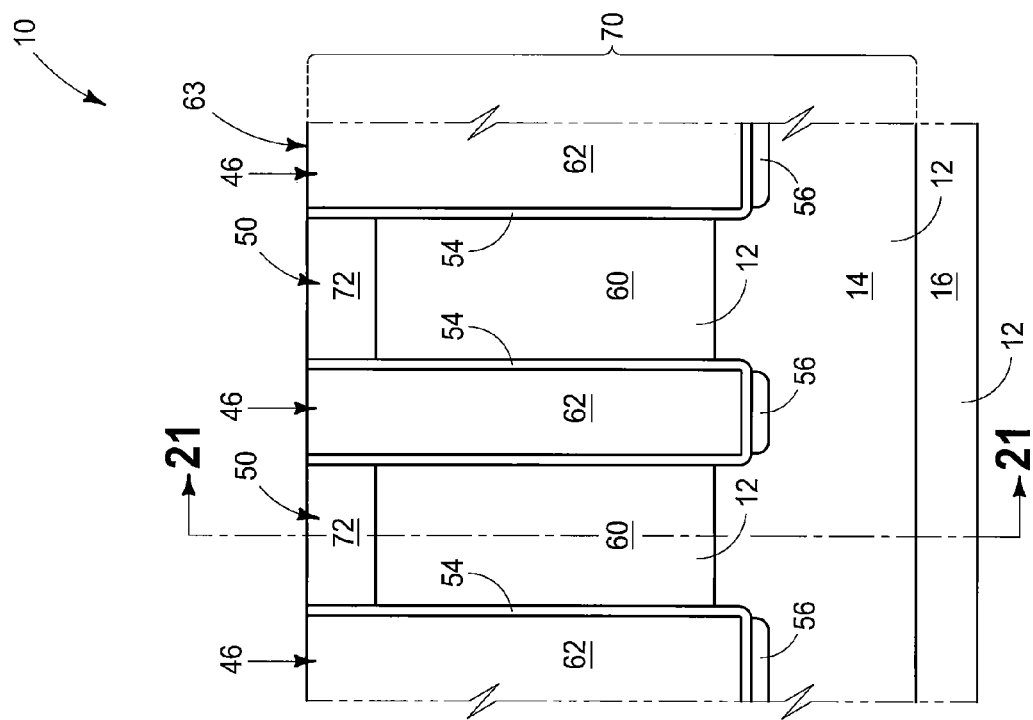

Referring to FIGS. 20-22, an upper portion of doped region 60 is counter-doped to form first type doped regions 72. The formation of regions 72 creates a stack 70 comprising the doped regions 14, 60 and 72. In some embodiments, the stack 58 of FIGS. 17-19 may be considered to be a first stack, and the stack 70 of FIGS. 20-22 may be considered to be a second stack formed by implanting dopant into the top of the first stack.

The first type dopant is implanted into insulative material within trenches 28 and 46, as well as into doped region 60. In some embodiments, at least about $1 \times 10^{19}$ atoms/cm$^3$ of first type dopant (i.e., the dopant type of the emitter/collector regions) may be present within such insulative material in a finished construction. In some embodiments, a region of the electrically insulative material within trenches 28 and 46 will comprise base implant dopant from the implant utilized to form doped region 60, and a portion of such region will comprise emitter implant dopant from the implant utilized to form emitter regions 72.

In some embodiments, the doped regions 72 within pedestals 50 will become emitter regions of BJT devices, while the doped regions 72 within pedestals 52 will be replaced with base contacts (as described below with reference to FIG. 23). According, the doped regions 72 may be considered to be comprised by two subsets, with one of the subsets comprising the doped regions 72 within pedestals 50 and the other comprising the doped regions 72 within pedestals 52.

The doped regions 72 may be either n-type or p-type majority doped, depending on whether the BJT is a pnp device or an npn device.

In some example embodiments, regions 72 are p-type doped; and are formed by implanting one or more suitable p-type species at suitable doses (for instance, regions 72 may be formed by implanting boron at a dose within a range of from about $1 \times 10^{14}$ atoms/cm$^2$ to about $2 \times 10^{16}$ atoms/cm$^2$).

The emitter and collector regions of BJT devices comprise a same dopant type as one another, and in some embodiments may be generically referred to as being emitter/collector regions, rather than being specifically an emitter region or a collector region. Accordingly, in some embodiments doped regions 14 and 72 may be referred to as emitter/collector implant regions. In other embodiments, doped region 14 may be referred to specifically as a collector region, and doped region 72 may be referred to specifically as an emitter implant region.

Figure 23:
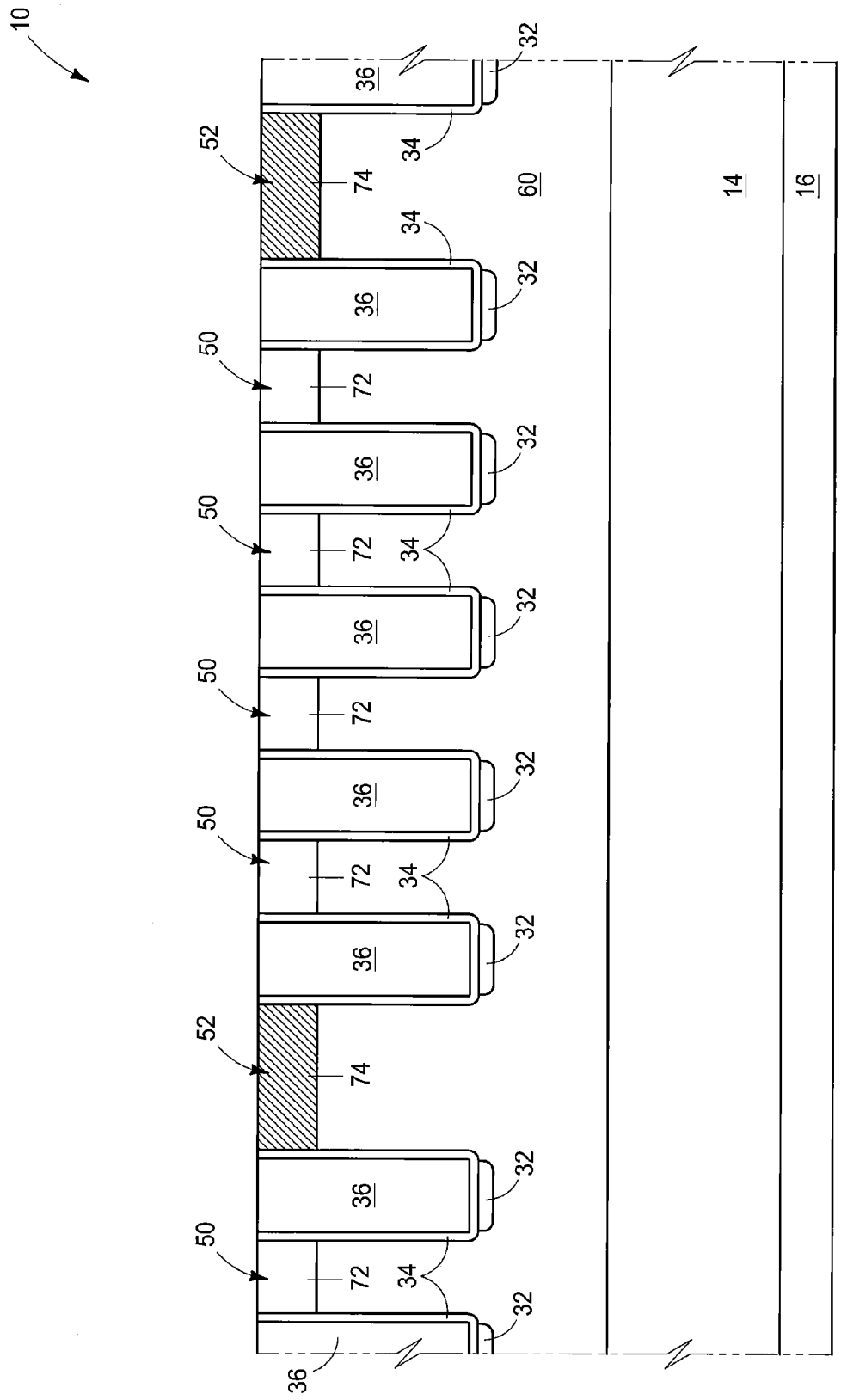
FIGS. 23 and 24 are views along the cross-section of FIG. 21 at processing stages subsequent to that of FIG. 21.

Referring to FIG. 23, the emitter regions 72 within wide pedestals 52 are counter-doped to convert such emitter regions into base contact regions 74. The base contact regions will have a same dopant type as base region 60. In some embodiments, the base contact regions will be n-type doped. In some embodiments, a masked implant is used to selectively implant doped regions 72 within pedestals 50 (e.g. the emitter regions), and the implant to form doped regions 74 within pedestals 52 (e.g. the base contact regions) is a reinforcement implant to reduce the contact resistance.

In some embodiments, thermal treatments may be minimized (in order to allow for shallower BJT diffusions). For example, it may be advantageous to conduct the implants of FIGS. 17-23 after formation of the trenches 28 and 46, and after formation of the insulative materials within such trenches, because then the base/emitter implants are not impacted by thermal treatments that may be utilized to form insulative materials within the trenches. In some embodiments, furnace annealing at temperatures greater than about 1000° C. are not compatible with the integration of logic structures in the regions of integrated circuitry peripheral to the memory array region (logic structures are described below in paragraph 0060). High-temperature furnace annealing may be used in conventional processing to fully recover base implant damage. On the other hand, Rapid Thermal Processes (RTP) at temperatures even higher than 1000° C. may be compatible with logic circuit integration but may not be able to fully recover base implant damage. With the method proposed here, a full recovering of base implant damage may be achieved without precluding logic circuit integration. Some embodiments may have no utilization of furnace annealing at temperatures greater than about 1000° C. after formation of one or more of the doped regions of FIGS. 17-23, which may be advantageous relative to conventional methods utilizing such furnace annealing.

In some embodiments (not shown) one or more of the implants described with reference to FIGS. 17-23 may be conducted after forming one of the trenches 28 and 46, and prior to forming the other.

Referring to FIG. 24, memory cells 76 are formed over the emitter regions 72, and are electrically coupled with the emitter regions. The memory cells may be RRAM cells. The illustrated memory cells comprise phase change material 78 (for instance, any suitable chalcogenide) between a heater 80 and an electrode 82; and thus may correspond to PCM cells. In some embodiments, the heaters may be directly against the emitter regions 72, and in other embodiments the heaters may be electrode coupled to the emitter regions 72 through one or more electrically conductive materials.

The pedestals 50 are comprised by a plurality of BJT devices which may be considered to be part of an array of BJT devices; with the cross-section of FIG. 24 being along a row of such array, and the cross-section section of FIG. 22 (discussed above) being along a column of such array. The regions 14 and 72 may be considered to be collector/emitter implant regions, and the regions 60 may be considered to be base implant regions between such emitter/collector implant regions. In some embodiments, region 14 is a collector implant region shared by BJT devices along columns and rows of the BJT array; region 60 is an example base region shared by BJT devices along a row of the array, but not shared between columns of the array; and regions 72 are emitter regions.

An electrically conductive tie 90 is shown to be coupled to the base contact regions 74 to electrically couple the illustrated pair of base contact regions to one another. Such tie couples to the base region 60 along a row of the BJT array, and may be formed and utilized in accordance with conventional processing.

The processing described above may be utilized to form memory structures in a memory array region of an integrated circuit. There may also be processing utilized to form logic structures in regions of the integrated circuit peripheral to the memory array region. In some embodiments, some of the steps described above may be intercalated between and/or combined with processing steps associated with the formation of the logic circuitry. For instance, the dopants provided in the various doped regions described with reference to FIGS. 1-24 may be activated together with dopants utilized in the logic circuitry. As another example, the doped region 14 of FIGS. 1-3 may be formed after forming isolation regions in the peripheral region and prior to forming gatelines of the logic transistors; and the doped region 60 of FIGS. 14-16 may be formed after forming the gatelines of the logic transistors.

The memory architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In an example embodiment, the invention includes a method of forming a plurality of bipolar junction transistors. First type dopant is implanted into a semiconductor material to form a first type doped region. First trenches are formed along a first direction within the first type doped region to a first depth. The first trenches are filled with one or more electrically insulative materials. Second trenches are formed along a second direction within the first type doped region to a second depth which is deeper than the first depth. The second direction intersects the first direction. The second trenches are filled with one or more electrically insulative materials. An array of pedestals of the semiconductor material is patterned by the forming of the first and second trenches. After forming the array of pedestals, an upper portion of the first type doped region is counter-doped to form a first stack comprising a second type doped region over a first type doped region. An upper portion of the first stack is counter-doped to form a second stack comprising a second type doped region between a pair of first type doped regions. One of the first type doped regions is a top region of the second stack and the other of the first type doped regions is a bottom region of the second stack. The first trenches extend only partially through the second type doped region, and the second trenches extend entirely through the second type doped region but only partially through the bottom region of the second stack. One of the first and second types is p-type and the other is n-type.

In an example embodiment, the invention includes a method of forming a memory array. First type dopant is implanted into a memory array region of a semiconductor material to form a first type doped region. First trenches are formed along a first direction within the first type doped region to a first depth. Second trenches are formed along a second direction within the first type doped region to a second depth which is deeper than the first depth. The first and second trenches together form an array of pedestals of the semiconductor material. The bottoms of the first trenches are reinforcement doped with second type dopant and then the first trenches are filled with one or more electrically insulative materials. The bottoms of the second trenches are reinforcement doped with first type dopant. The second trenches are filled with one or more electrically insulative materials. After the first and second trenches are filled with the electrically insulative materials, an upper portion of the first type doped region is counter-doped to form a first stack comprising a second type doped region over a first type doped region. An upper portion of the first stack is counter-doped to form a second stack comprising a second type doped region between a pair of first type doped regions. The second type doped region comprises base regions of bipolar transistors, the bottom first type doped region is a collector region of the bipolar transistors and the top first type doped region comprises emitter regions of the bipolar transistors. The first trenches extend only partially through the base regions, and the second trenches extend entirely through the base regions but only partially through the collector region. One of the first and second types is p-type and the other is n-type. Memory cells are formed over and electrically coupled with at least some of the emitter regions.

In an example embodiment, the invention includes an array of bipolar junction transistors. A stack of implant regions is within a semiconductor material, with the stack comprising a base implant region between a pair of emitter/collector implant regions. One of the emitter/collector implant regions is a top emitter/collector region and the other of the emitter/collector implant regions is a bottom emitter/collector region. The emitter/collector implant regions are a first type and the base implant region is a second type, with one of the first and second types being p-type and the other being n-type. First trenches extend along a first direction within the stack; and second trenches extending along a second direction within the stack. The first trenches penetrate only partially through the base implant region, and the second trenches penetrate entirely through the base implant region but only partially through the bottom emitter/collector region. The second direction intersects the first direction. Electrically insulative material is within the first and second trenches. At least some of the electrically insulative material comprises at least about $7 \times 10^{16}$ atoms/cm$^3$ of second type dopant. In some embodiments, a portion of the electrically insulative material also comprises at least about $1 \times 10^{19}$ atoms/cm$^3$ of first type dopant.

In an example embodiment, the invention includes a memory array. A stack of implant regions is within a semiconductor material. The stack comprises, in ascending order, a bottom emitter/collector implant region, a base implant region, and a top emitter/collector implant region. The emitter/collector implant regions are a first type and the base implant region is a second type, with one of the first and second types being p-type and the other being n-type. First trenches extend along a first direction within the stack, and second trenches extend along a second direction within the stack. The first trenches penetrate only partially through the base implant region, and the second trenches penetrate entirely through the base implant region but only partially through the bottom emitter/collector region. The second direction intersects the first direction. First type reinforcement doping is at the bottoms of the second trenches, and second type reinforcement doping is at the bottoms of the first trenches. Electrically insulative material is within the first and second trenches. At least some of the electrically insulative material comprises at least about $7\times10^{16}$ atoms/cm$^3$ of second type dopant. Memory cells are over and electrically connected with the top emitter/collector implant region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of bipolar junction transistors, comprising:
    implanting first type dopant into a semiconductor material to form a first type doped region;
    forming first trenches along a first direction within the first type doped region to a first depth;
    filling the first trenches with one or more electrically insulative materials;
    forming second trenches along a second direction within the first type doped region to a second depth which is deeper than the first depth, the second direction intersecting the first direction;
    filling the second trenches with one or more electrically insulative materials;
    an array of pedestals of the semiconductor material being patterned by the forming of the first and second trenches;
    after forming the array of pedestals, counter-doping an upper portion of the first type doped region to form a first stack comprising a second type doped region over a first type doped region;
    counter-doping an upper portion of the first stack to form a second stack comprising a second type doped region between a pair of first type doped regions; one of the first type doped regions being a top region of the second stack and the other of the first type doped regions being a bottom region of the second stack;
    wherein the first trenches extend only partially through the second type doped region;
    wherein the second trenches extend entirely through the second type doped region but only partially through the bottom region of the second stack; and
    wherein one of the first and second types is p-type and the other is n-type.

2. The method of claim 1 wherein the semiconductor material comprises monocrystalline silicon.

3. The method of claim 1 wherein the second trenches are formed after the first trenches.

4. The method of claim 1 wherein the second trenches are formed before the first trenches.

5. The method of claim 1 further comprising counter-doping a portion of the top region of the second stack with second type dopant to form base contact regions.

6. The method of claim 1 further comprising reinforcement doping along bottoms of the first trenches with second type dopant prior to filling the first trenches with the one or more electrically insulative materials.

7. The method of claim 1 further comprising reinforcement doping along bottoms of the second trenches with first type dopant prior to filling the second trenches with the one or more electrically insulative materials.

8. The method of claim 1 wherein a construction comprising the first stack is subjected to no furnace annealing above about 1000° C. after the counter-doping of the upper portion of the first stack.

9. A method of forming a memory array, comprising:
    implanting first type dopant into a memory array region of a semiconductor material to form a first type doped region;
    forming first trenches along a first direction within the first type doped region to a first depth;
    reinforcement doping the bottoms of the first trenches with second type dopant and then filling the first trenches with one or more electrically insulative materials;
    forming second trenches along a second direction within the first type doped region to a second depth which is deeper than the first depth; the first and second trenches together forming an array of pedestals of the semiconductor material;
    reinforcement doping the bottoms of the second trenches with first type dopant and then filling the second trenches with one or more electrically insulative materials;
    after filling the first and second trenches with electrically insulative materials, counter-doping an upper portion of the first type doped region to form a first stack comprising a second type doped region over a first type doped region;
    counter-doping an upper portion of the first stack to form a second stack comprising a second type doped region between a pair of first type doped regions; the second type doped region comprising base regions of bipolar transistors, the bottom first type doped region being a collector region of the bipolar transistors and the top first type doped region comprising emitter regions of the bipolar transistors;
    forming memory cells over and electrically coupled with at least some of the emitter regions;
    wherein the first trenches extend only partially through the base regions;
    wherein the second trenches extend entirely through the base regions but only partially through the collector region; and
    wherein one of the first and second types is p-type and the other is n-type.

10. The method of claim 9 wherein the memory cells are RRAM cells.

11. The method of claim 9 wherein the memory cells are phase change memory cells.

12. A method of forming a plurality of bipolar junction transistors, comprising:
    implanting first type dopant into a semiconductor material to form a first type doped region;
    forming first trenches along a first direction within the first type doped region to a first depth;
    filling the first trenches with one or more electrically insulative materials;
    forming second trenches along a second direction within the first type doped region to a second depth which is deeper than the first depth, the second direction intersecting the first direction;
    filling the second trenches with one or more electrically insulative materials;
    an array of pedestals of the semiconductor material being patterned by the forming of the first and second trenches;

after forming the array of pedestals, counter-doping an upper portion of the first type doped region to form a first stack comprising a second type doped region over a first type doped region;

counter-doping an upper portion of the first stack to form a second stack comprising a second type doped region between a pair of first type doped regions; one of the first type doped regions being a top region of the second stack and the other of the first type doped regions being a bottom region of the second stack;

wherein the first trenches extend only partially through the second type doped region;

wherein the second trenches extend entirely through the second type doped region but only partially through the bottom region of the second stack;

wherein one of the first and second types is p-type and the other is n-type;

wherein the semiconductor material comprises monocrystalline silicon;

counter-doping a portion of the top region of the second stack with second type dopant to form base contact regions; and reinforcement doping along bottoms of the first trenches with second type dopant prior to filling the first trenches with the one or more electrically insulative materials.

* * * * *